(12) United States Patent
Yamamoto et al.

(10) Patent No.: US 11,511,794 B2
(45) Date of Patent: Nov. 29, 2022

(54) ELECTRIC DRIVER DEVICE

(71) Applicant: DENSO CORPORATION, Kariya (JP)

(72) Inventors: Toshihisa Yamamoto, Kariya (JP);
Naoki Matsuda, Kariya (JP)

(73) Assignee: DENSO CORPORATION, Kariya (JP)

(*) Notice: Subject to any disclaimer, the term of this patent is extended or adjusted under 35 U.S.C. 154(b) by 162 days.

(21) Appl. No.: 16/874,660

(22) Filed: May 14, 2020

(65) Prior Publication Data

US 2020/0361518 A1 Nov. 19, 2020

(30) Foreign Application Priority Data

May 17, 2019 (JP) .............................. JP2019-093619

(51) Int. Cl.
*B62D 5/04* (2006.01)
*H03K 19/20* (2006.01)
*H02P 27/06* (2006.01)

(52) U.S. Cl.
CPC ............ *B62D 5/046* (2013.01); *B62D 5/0484* (2013.01); *B62D 5/0487* (2013.01); *H02P 27/06* (2013.01); *H03K 19/20* (2013.01)

(58) Field of Classification Search
CPC ..... B62D 5/046; B62D 5/0484; B62D 5/0487
See application file for complete search history.

(56) References Cited

U.S. PATENT DOCUMENTS

| 2014/0055059 A1* | 2/2014 | Uryu ....................... H02P 27/06 318/9 |
| 2017/0217481 A1* | 8/2017 | Asao ..................... B62D 5/0487 |
| 2018/0208236 A1* | 7/2018 | Asao ................... H02P 29/0241 |

FOREIGN PATENT DOCUMENTS

| FR | 2974055 A1 * | 10/2012 | ............. B62D 5/046 |
| JP | 2005-053340 A | 3/2005 | |
| JP | 2008013146 A * | 1/2008 | ........... B62D 5/0463 |
| JP | 2017-077832 A | 4/2017 | |

* cited by examiner

*Primary Examiner* — Jacob D Knutson
(74) *Attorney, Agent, or Firm* — Maschoff Brennan

(57) ABSTRACT

An electric driver device provides a partial redundancy system that is at least partially redundant, or a full redundancy system. The electric driver device has a plurality of circuit systems. The electric driver device includes, in at least a part of the electric circuit, a common circuit extending over at least two of a plurality of circuit systems. The common circuit includes a power supply and/or a connection line that complements signals. At least one of the power supply circuit, an interface circuit, a power supply cutoff circuit, and a connector is not separated and independent from each other for each redundant circuit system.

4 Claims, 36 Drawing Sheets

ELECTRIC DRIVER DEVICE

CROSS REFERENCE TO RELATED APPLICATIONS

The present application claims the benefit of priority from Japanese Patent Application No. 2019-93619 filed on May 17, 2019. The entire disclosure of the above application are incorporated herein by reference.

TECHNICAL FIELD

The present disclosure relates to an electric driver device.

BACKGROUND

An electric driver device electrically drives an electric device, such as a motor, a solenoid, a magnet etc. The electric driver device is required to provide high reliability. From the viewpoint described above or from other unmentioned viewpoints, there is demand for further improvement to the electric driver device.

SUMMARY

At least one embodiment of the present disclosure provides an electric driver device. The electric driver device comprises: a motor for driving an object to be driven; and an electric circuit including a plurality of circuit systems for controlling the motor, wherein each of the plurality of circuit systems includes: a power conversion circuit for controlling power supplied to the motor; an arithmetic processing unit circuit for calculating a control amount of the power conversion circuit according to a plurality of input/output signals; and a drive circuit for driving the power conversion circuit in response to a command from the arithmetic processing device, wherein at least one of the circuit is provided by a common circuit which is common over at least two of the plurality of circuit systems, and wherein the circuits includes a power cutoff circuit which cuts off power supply to the motor, an interface circuit which processes the plurality of input/output signals, and a power supply circuit which supplies power to the arithmetic processing unit circuit and the interface circuit.

According to the disclosed electric driver device, at least one of the power cutoff circuit, the interface circuit, and the power supply circuit is provided by a common circuit common to a plurality of circuit systems. By providing a plurality of circuit systems, reliability is improved by redundancy provided, and efficiency is improved by a common circuit.

At least one embodiment of the present disclosure provides an electric driver device. The electric driver device comprises: a motor for driving an object to be driven; and an electric circuit including a plurality of circuit systems for controlling the motor; and at least two connectors having a plurality of electrodes for connecting a power supply and a plurality of input/output signals, wherein the plurality of electrodes are asymmetrically arranged on the plurality of connectors.

According to the disclosed electric driver device, the plurality of electrodes are asymmetrically arranged in the plurality of connectors. Therefore, even if erroneous connection occurs in a plurality of connectors, a plurality of input/output signal lines are not connected in a proper manner as designed. Therefore, erroneous connection in the connector can be reliably revealed while maintaining the reliability of the electric driver device including the electric circuit.

At least one embodiment of the present disclosure provides an electric driver device. The electric driver device comprises: a motor for driving an object to be driven; an electric circuit including a plurality of circuit systems for controlling the motor; and an odd number of connector having a plurality of electrodes for connecting a power supply and a plurality of input/output signals.

According to the disclosed electric drive device, the electric circuit is made redundant by providing a plurality of circuit systems. Therefore, the reliability of the electric driver device including the electric circuit is improved. On the other hand, the odd-number of connector enables more efficient connection of the power supply and the plurality of input/output signals to the plurality of circuit systems.

The disclosed aspects in this specification adopt different technical solutions from each other in order to achieve their respective objectives. Reference numerals in parentheses described in claims and this section exemplarily show corresponding relationships with parts of embodiments to be described later and are not intended to limit technical scopes. The objects, features, and advantages disclosed in this specification will become apparent by referring to following detailed descriptions and accompanying drawings.

DESCRIPTION OF EMBODIMENT

Figure 1:
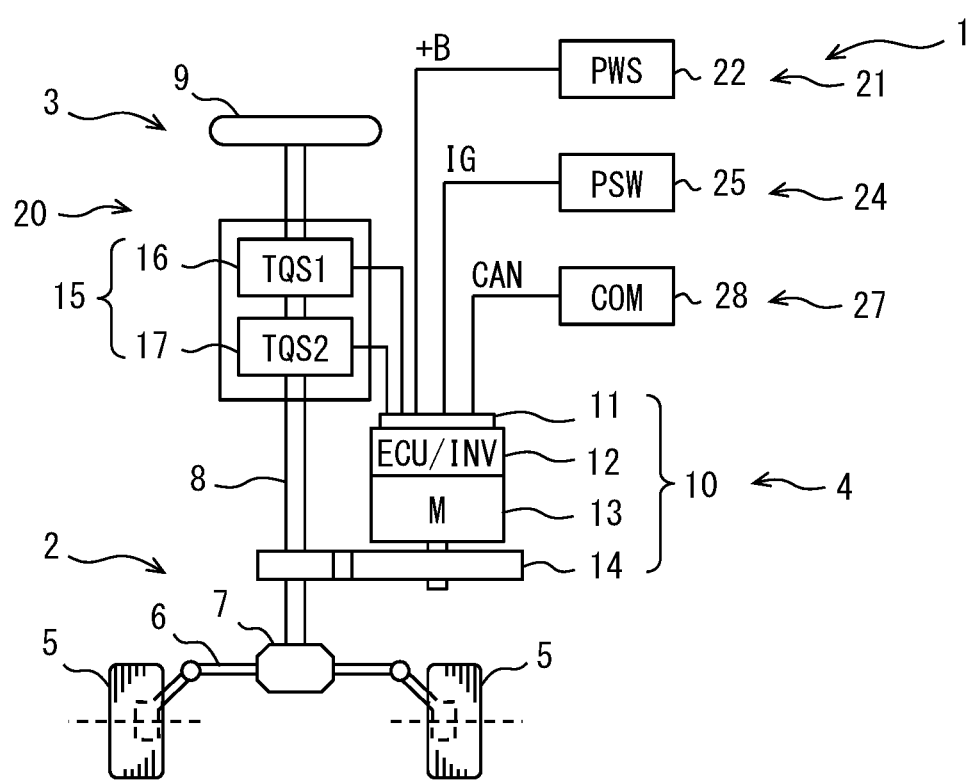
FIG. 1 is a block diagram of a system according to a first embodiment.

Several embodiments will be described with reference to the drawings. In some embodiments, parts which are functionally and/or structurally corresponding and/or associated are given the same reference numerals, or reference numerals with different hundreds digit or higher digits. For corresponding parts and/or associated parts, reference can be made to the description of other embodiments.

JP6223593B may help and improve understanding of the disclosure in this specification. JP6223593B shows an electric driver device having a power supply circuit, an input circuit, an output circuit, a power supply relay circuit, a central processing unit, and a connector. These components are separated and independent from each other in two systems and are arranged side by side. From the viewpoint described above or from other unmentioned viewpoints, there is demand for further improvement to the electric driver device. The disclosure in this specification provides a reliable electric driver device.

First Embodiment

FIG. 1 shows an electric steering apparatus 1 which is a system for a vehicle. The electric steering device 1 operates a steering mechanism 2 of the vehicle. The steering mechanism 2 changes a moving direction of the vehicle. Note that the term vehicle in this specification should be interpreted in a broad sense, and includes a land vehicle, a ship, an aircraft, a simulation device, and an amusement device. The steering mechanism 2 operates a direction of a wheel or a direction of a rudder. The electric steering device 1 has a manual operation mechanism 3. The manual operation mechanism 3 enables a user to perform a manual operation. The electric steering device 1 has an electric drive mechanism 4. The electric drive mechanism 4 enables steering related to the user's intention and/or steering in response to a request from another control device without being related to the user's intention. The electric drive mechanism 4 functions, for example, to assist an operation force of the user. Alternatively or additionally, the electric drive mechanism 4 functions, for example, to provide an operating force for automatic driving. The electric steering device 1 is also called an electric power assist steering device.

The steering mechanism 2 changes the moving direction of the vehicle by deflecting a rotation axis of the wheel 5. The steering mechanism 2 includes, for example, wheels 5, a steering hub, a tie rod 6, a steering gear box 7, and a steering column 8. The rotation of the steering column 8 is converted into parallel movement by the steering gear box 7 and transmitted to the tie rod 6. The steering gear box 7 can be provided by a rack and pinion type or a ball and nut type. The tie rod 6 deflects the rotation axis of the wheel 5 by operating the steering hub. The manual operation mechanism 3 has a steering handle 9. The steering handle 9 is operated by a user to rotate the steering column 8. An electric drive mechanism 4 has an electric driver device 10. The electric driver device 10 drives a steering mechanism 2 as a drive target.

The electric driver device 10 includes a connector 11, an electric circuit (ECU/INV) 12, a motor (M) 13, and a power transmission mechanism 14. The connector 11 is an electrical connection member including a plurality of electrodes. The connector 11 has a fixed part belonging to the electric driver device 10 and a movable part belonging to the vehicle side. The electric circuit 12 includes a control device (ECU) that functions with relatively low power, and an inverter circuit (INV) as a large power circuit for the motor 13. The electric circuit 12 includes a plurality of circuit systems that control the motor 13. The electric circuit 12 includes two circuit systems 12a and 12b. The two circuit systems 12a and 12b make the control system for the motor 13 redundant. The word of redundancy is also called multiplexing.

The motor 13 includes a rotor and a stator. The stator includes a stator core and a stator coil. The motor 13 drives an object to be driven. The motor 13 includes a single rotor and at least two stator coils. The two circuit systems provided by the two stator coils improve the reliability of the motor 13. Note that the motor 13 may include two rotor core portions that provide two systems. Further, the motor 13 may include three or more circuit systems. The power transmission mechanism 14 transmits the torque of the motor 13 to the steering column 8. The power transmission mechanism 14 can be provided by various mechanisms such as a gear train and a chain.

The electric steering device 1 includes a control system 20 including an electric circuit 12. The control system 20 includes a torque sensor system 15, a power supply system 21, an operation switch system 24, and a communication system 27. The torque sensor system 15 detects an operation force by which a user operates the manual operation mechanism 3. The power supply system 21 supplies power to the electric circuit 12 and the motor 13. The operation switch system 24 switches between an operation state and a stop state of the electric steering device 1. The communication system 27 provides data communication between a plurality of devices in the vehicle.

The torque sensor system 15 has at least two torque sensors including a torque sensor (TQS1) 16 and a torque sensor (TQS2) 17. The torque sensors 16 and 17 detect a torque acting on the steering column 8. The detected torque indicates an operation force acting on the manual operation mechanism 3. At least two of the plurality of torque sensors 16 and 17 provide a redundant torque sensor system 15. The redundant torque sensor system 15 improves the reliability of the control system 20. The torque sensor signals TQS1 and TQS2 may include a plurality of signal lines.

The power supply system 21 has a single power supply device (PWS) 22. The power supply device 22 supplies power to at least the electric circuit 12 and the motor 13. The power supply device 22 is a power supply mounted on the vehicle. The power supply device 22 may include various power supplies such as a battery, a generator, and a fuel cell. A main power supply +B is a power supply for the motor 13 and also a control power supply for the controllers 51 and 71. The main power supply +B may include a positive electrode line and a negative electrode line.

The operation switch system 24 has a single operation switch device (PSW) 25. The operation switch device 25 includes a switch indicating the operation state and the stop state of the electric steering device 1. The operation switch device 25 is, for example, a switch operated by a user. The operation switch device 25 is called by various names such as a power switch, an ignition switch, and an activation switch. The operation switch device 25 outputs an operation signal indicating the operation state and the stop state. Furthermore, the operation switch device 25 may supply power to the electric circuit 12 in the operation state, and may cut off the power supply in the stop state. In this embodiment, the operation switch device 25 controls both the operation signal and the power supply. The operation switch signal IG is supplied by the operation switch device 25. The operation switch signal IG is a signal for the control devices 51 and 71 and also a power supply. The operation switch signal IG is also called an ignition signal, a power switch signal, or the like.

The communication system 27 has a single communication line (COM) 28. The communication line 28 receives data transmitted from another device in the vehicle and inputs the data to the electric circuit 12. The communication line 28 transmits data output from the electric circuit 12 to another device. The communication line 28 is provided by a computer network. The communication line 28 can be provided by a standard called CAN (registered trademark) (Controller Area Network), for example. The communication line 28 is used, for example, to receive speed data, and is used to transmit steering angle data. The communication data CAN may pass through a plurality of signal lines such as an H signal and an L signal.

The control device in this specification may be referred to as an electronic control unit (ECU: Electronic Control Unit). The control device or the control system is provided by (a) an algorithm as a plurality of logic called an if-then-else form, or (b) a learned model tuned by machine learning, e.g., an algorithm as a neural network.

The control device is provided by a control system including at least one computer. The control system may include a plurality of computers linked by data communication devices. The computer includes at least one processor (hardware processor) that is hardware. The hardware processor can be provided by the following (i), (ii), or (iii).

(i) The hardware processor may be at least one processor core that executes a program stored in at least one memory. In this case, the computer is provided by at least one memory and at least one processor core. The processor core is called a CPU: Central Processing Unit, a GPU: Graphics Processing Unit, a RISC-CPU, or the like. The memory is also called a storage medium. The memory is a non-transitory and tangible storage medium, which non-temporarily stores a program and/or data readable by the processor. The storage medium may be a semiconductor memory, a magnetic disk, an optical disk, or the like. The program may be distributed as a single unit or as a storage medium in which the program is stored.

(ii) The hardware processor may be a hardware logic circuit. In this case, the computer is provided by a digital circuit including a number of programmed logic units (gate circuits). The digital circuit is also called a logic circuit array, for example, ASIC: Application-Specific Integrated Circuit, FPGA: Field Programmable Gate Array, SoC: System on a Chip, PGA: Programmable Gate Array, or CPLD: Complex Programmable Logic Device. The digital circuit may comprise a memory storing programs and/or data. The computer may be provided by an analog circuit. A computer may be provided by a combination of a digital circuit and an analog circuit.

(iii) The hardware processor may be a combination of the above (i) and the above (ii). (i) and (ii) are placed on different chips or on a common chip. In these cases, the part (ii) is also called an accelerator.

The control device, the signal source, and the control object provide various elements. At least some of these elements can be referred to as blocks, modules, or sections. Furthermore, elements included in the control system are referred to as functional means only when intentional.

Figure 2:
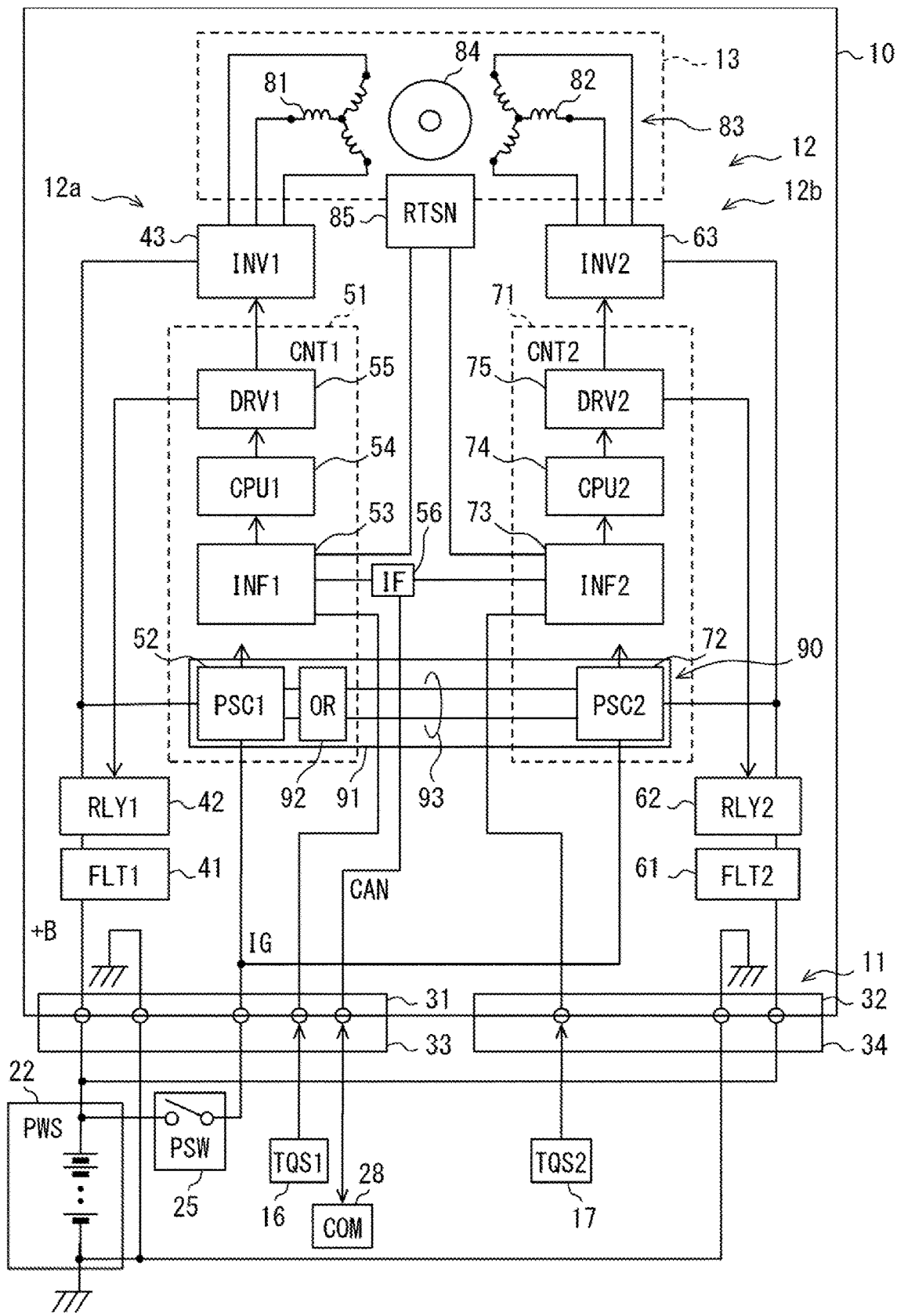
FIG. 2 is an electric block diagram of an electric driver device.

A control units and methods described in the present disclosure may be implemented by a special purpose computer which is configured with a memory and a processor programmed to execute one or more particular functions embodied in computer programs of the memory. Alternatively, the control unit and the method described in the present disclosure may be implemented by a dedicated computer configured as a processor with one or more dedicated hardware logic circuits. Alternatively, the control unit and the method described in the present disclosure may be realized by one or more dedicated computer, which is configured as a combination of a processor and a memory, which are programmed to perform one or more functions, and a processor which is configured with one or more hardware logic circuits. The computer programs may be stored, as instructions to be executed by a computer, in a tangible non-transitory computer-readable medium. FIG. 2 shows a detailed configuration of the electric driver device 10. The components indicated by alphabetic characters and the numeral 1 may be named "first". The components indicated by an alphabetic character and the numeral 2 may be named "second".

The connector 11 has a plurality of electrodes. The connector 11 has a first connector including a device-side connector 31 and a vehicle-side connector 33, and a second connector including a device-side connector 32 and a vehicle-side connector 34. The electric driver device 10 has a connector 31 and a connector 32.

In the connector 11, the operation switch system 24 passes only through the connector 31. In addition, in the connector 11, the communication system 27 passes only through the connector 31. That is, in the connector 11, the connector 31 and the connector 32 have the electrodes arranged in an offset manner. The connector 31 and the connector 32 are not arranged in parallel.

The electric circuit 12 has two power paths for the main power (+B) supplied from the power supply device 22. The main power (+B) supplied from the power supply device 22 is branched into the two power paths outside the electric driver device 10. Each of the two power paths has a filter circuit (FLT1) 41 and a filter circuit (FLT2) 61 for blocking noise of the main power supply. Each of the two power paths has a power cutoff circuit (RLY1) 42 and a power cutoff circuit (RLY2) 62, respectively. The power cutoff circuits 42 and 62 are provided between the connector 11 and the motor 13 to interrupt the power supply. The power cutoff circuits 42 and 62 are also called relay circuits. The power cutoff circuits 42 and 62 may include an electromagnetic relay or a semiconductor switch element. Each of the two power paths has a power conversion circuit (INV1) 43 and a power conversion circuit (INV2) 63. The power conversion circuits 43 and 63 control the power supplied to the motor 13 according to a command from a control device described later. The power conversion circuits 43 and 63 control the power supplied from the power supply to the motor 13. The power conversion circuits 43 and 63 are multi-phase power conversion circuits. In this embodiment, the power conversion circuits 43 and 63 are three-phase power conversion circuits. The power conversion circuits 43 and 63 are also called inverter circuits.

The electric circuit 12 has a control device (CNT1) 51 and a control device (CNT2) 71 corresponding to each of the two power supply paths. The control device 51 includes a power supply circuit (PSC1) 52, an interface circuit (INF1) 53, an arithmetic processing unit circuit (CPU1) 54, and a drive circuit (DRV1) 55. The control device 71 includes a power supply circuit (PSC2) 72, an interface circuit (INF2) 73, an arithmetic processing unit circuit (CPU2) 74, and a drive circuit (DRV2) 75.

The power supply circuits 52 and 72 supply a constant voltage lower than the voltage supplied from the power supply device 22. Each of the power supply circuits 52 and 72 is a constant voltage power supply for the arithmetic processing unit circuit. The power supply circuits 52 and 72 supply power to the arithmetic processing unit circuits 54 and 74 and the interface circuits 53 and 73. The power supply circuits 52 and 72 constitute a common circuit 90 which is a substantial set of circuit. The common circuit 90 constitutes a set of common power supply circuit 91 as a whole. The common power supply circuit 91 includes an OR circuit (OR) 92. In the common power supply circuit 91, the two power supply circuits 52 and 72 are connected via a connection line 93 so as to complement their power supplies. As a result, in the common power supply circuit 91, the power supply circuits 52 and 72 are not independently separated each other, but are integrated with each other to provide a continuous circuit. When one power supply is lost, this common power supply circuit 91 makes it possible to supply a power of the other power supply to one circuit. In other words, in the common power supply circuit 91, a relationship which complements one power supply each other at a lost of the other power supply.

Figure 3:
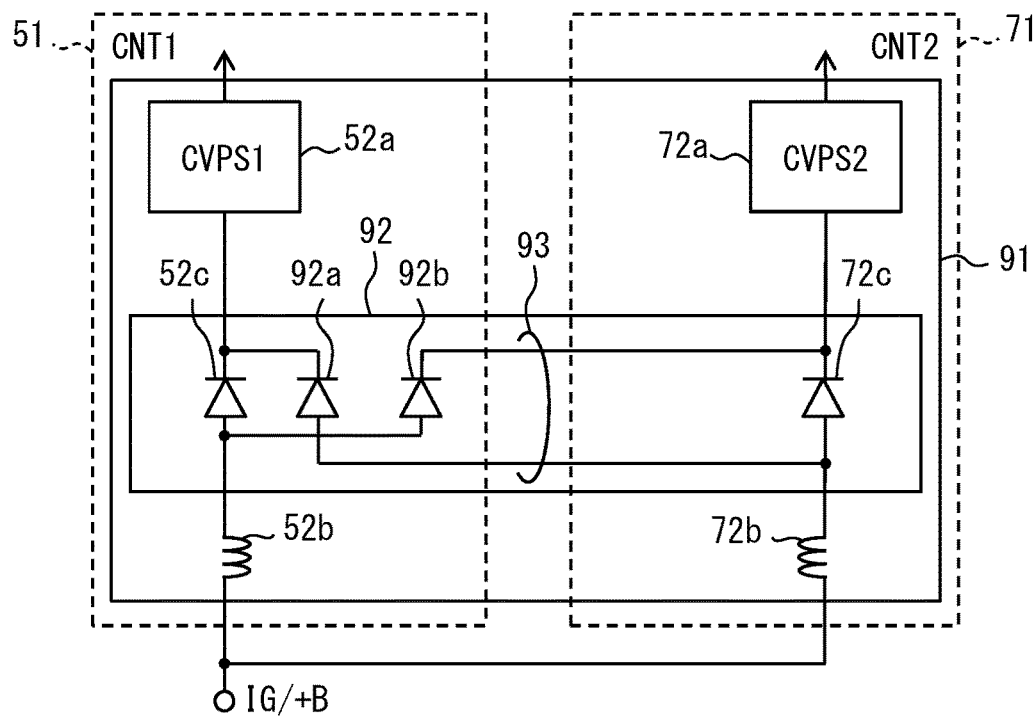
FIG. 3 is a circuit diagram of a power supply circuit.

In FIG. 3, the common power supply circuit 91 includes a plurality of electric elements arranged over both the control device 51 and the control device 71. The electric element includes a conductor pattern for providing a circuit and an electric element. The common power supply circuit 91 has a constant voltage power supply circuit (CVPS1) 52a for the control device 51 and a constant voltage power supply circuit (CVPS2) 72a for the control device 71.

In FIG. 2 and FIG. 3, the operation switch signal IG supplied from the operation switch device 25 is branched into two paths inside the electric driver device 10. The common power supply circuit 91 receives a main power supply +B as a power supply and an operation switch signal IG (operation switch power supply IG). The common power supply circuit 91 includes filter circuits 52b and 72b in each of two power supply systems. The filter circuits 52b and 72b block noise in the power supply. The filter circuits 52b and 72b include choke coils.

The common power supply circuit 91 includes an OR circuit 92. The OR circuit 92 is provided by diode elements 52c and 72c for preventing reverse connection and additional diode elements 92a and 92b. The diode elements 52c and 72c are arranged in the forward direction with respect to the power supply. The diode element 92a is arranged in the forward direction between an anode of the diode element 72c and a cathode of the diode element 52c. The diode element 92b is arranged in the forward direction between an anode of the diode element 52c and a cathode of the diode element 72c. The OR circuit 92 includes two connection lines 93. When one power supply is lost due to some kind of failure, the OR circuit 92 makes it possible to supply the other power supply to one constant voltage power supply circuit. The common power supply circuit 91 complements one power supply each other between the two control devices 51 and 71 by the OR circuit 92. The OR circuit 92 is also called a diode OR circuit.

Returning to FIG. 2, the interface circuits 53 and 73 are I/O circuits. The interface circuit 53 and 73 processes input signals and output signals of the arithmetic processing unit circuits 54 and 74. The interface circuit 53 provides an I/O circuit for the control device 51. The interface circuit 73 provides an I/O circuit for the control device 71. The interface circuit 53 inputs a detection signal of the torque sensor 16, communication data via the communication line 28, and a detection signal of a rotational position detector 85 described later. The interface circuit 73 inputs a detection signal of the torque sensor 17, communication data via the communication line 28, and a detection signal of the rotational position detector 85 described later. The electric circuit 12 includes a communication interface circuit 56 that processes communication data via the communication line 28. In this embodiment, a single communication interface circuit 56 is provided as a circuit belonging to the control device 51. The interface circuit 73 transmits and receives communication data via the communication interface circuit 56.

The arithmetic processing unit circuits 54 and 74 have a so-called arithmetic processing unit (CPU) and a memory. The memory stores programs and data. The arithmetic processing unit circuits 54 and 74 execute arithmetic processing programmed in advance. The arithmetic processing unit circuits 54 and 74 calculate the control amounts according to the input/output signals and control the drive circuits 55 and 75. The arithmetic processing unit circuit 54 executes a control process for the control device 51. The arithmetic processing unit circuit 74 executes a control process for the control device 71. The arithmetic processing unit 54 controls the drive circuit 55 according to the data input from the interface circuit 53. The arithmetic processing unit 74 controls the drive circuit 75 according to the data input from the interface circuit 73.

The drive circuits 55 and 75 are circuits for controlling the power cutoff circuits 42 and 62 and the power conversion circuits 43 and 63 which are high power systems by the control devices 51 and 71 which are low power systems. The drive circuits 55 and 75 output drive signals for the power cutoff circuits 42 and 62 and the power conversion circuits 43 and 63. The drive circuit 55 controls the power cutoff circuit 42 and the power conversion circuit 43 according to a command from the arithmetic processing unit circuit 54. The drive circuit 75 controls the power cutoff circuit 62 and the power conversion circuit 63 according to a command from the arithmetic processing unit circuit 74.

The motor 13 has two stator coils 81 and 82. The stator coils 81 and 82 are mounted on a single stator core 83. The motor 13 has a single rotor 84. The stator coil 81 is connected to the power conversion circuit 43. Therefore, the power of the stator coil 81 is supplied from the first power supply system including the power supply cutoff circuit 42. The stator coil 82 is connected to the power conversion circuit 63. Therefore, the power of the stator coil 82 is supplied from the first power supply system including the power supply cutoff circuit 62. The motor 13 includes a rotational position detector (RTSN) 85. The rotational position detector (RTSN) 85 includes redundant two pair of sensor groups and output circuits. The redundant rotational position detector 85 increases the reliability of the electric circuit 12 and the motor 13.

The motor 13 is made redundant by having two stator coils 81 and 82. The torque sensor system 15 is made redundant by including two torque sensors 16 and 17. On the other hand, the power supply system 21 is not redundant. The operation switch system 24 is not redundant. The communication system 27 is not redundant. In other words, at least a part of the electric steering device 1 is made redundant. Therefore, the electric steering device 1 in this embodiment is called a partial redundancy system.

In the electric driver device 10, redundancy is achieved in a plurality of circuits including the stator coils 81 and 82. However, the connector 11 and the common circuit 90 are not made redundant. Therefore, the electric driver device 10 in this embodiment is a partial redundancy system.

According to this embodiment, a highly reliable electric steering device 1 is provided. According to this embodiment, a highly reliable electric driver device 10 is provided. The connector 11 provides two connectors 31 and 32 belonging to the electric driver device 10. In other words, the connector 11 provides at least two connectors 31 and 32 having a plurality of electrodes for connecting a power supply and a plurality of input/output signals. However, in the plurality of connectors 31 and 32, the plurality of electrodes are asymmetrically arranged. The plurality of electrodes are not independently separated in the connectors 31 and 32 for each circuit system. A plurality of electrodes providing one function are intensively arranged in one connector. For example, the electrodes for the power switch signal IG or the communication data CAN are arranged only in the first connector 31. If the connectors 33 and 34 are incorrectly connected to the connectors 31 and 32, the control devices 51 and 71 cannot function normally. As a result, according to this embodiment, it is possible to reveal erroneous assembly in the connector 11.

The common power supply circuit 91 is configured to complement each other's power supply in the two control devices 51 and 71. Therefore, even when one power supply fails, power can be supplied from the other power supply to one circuit, and the functions of the two control devices 51 and 71 can be maintained. As described above, the common circuit 90 provides a circuit. This circuit makes the two power supply circuits as a set of circuit, and complement the plurality of power supplies each other, while without t independently separating them each other. The partial redundancy system provides high reliability. Further, the common circuit 90 enables to complement supply power each other while allowing the power supply system to be redundant, thereby providing an efficient circuit.

Second Embodiment

This embodiment is a modification based on the preceding embodiment. In the above embodiment, the electric steering device 1 provides a partial redundancy system. Alternatively, in this embodiment, the electric steering device 1 provides a full redundancy system.

Figure 4:
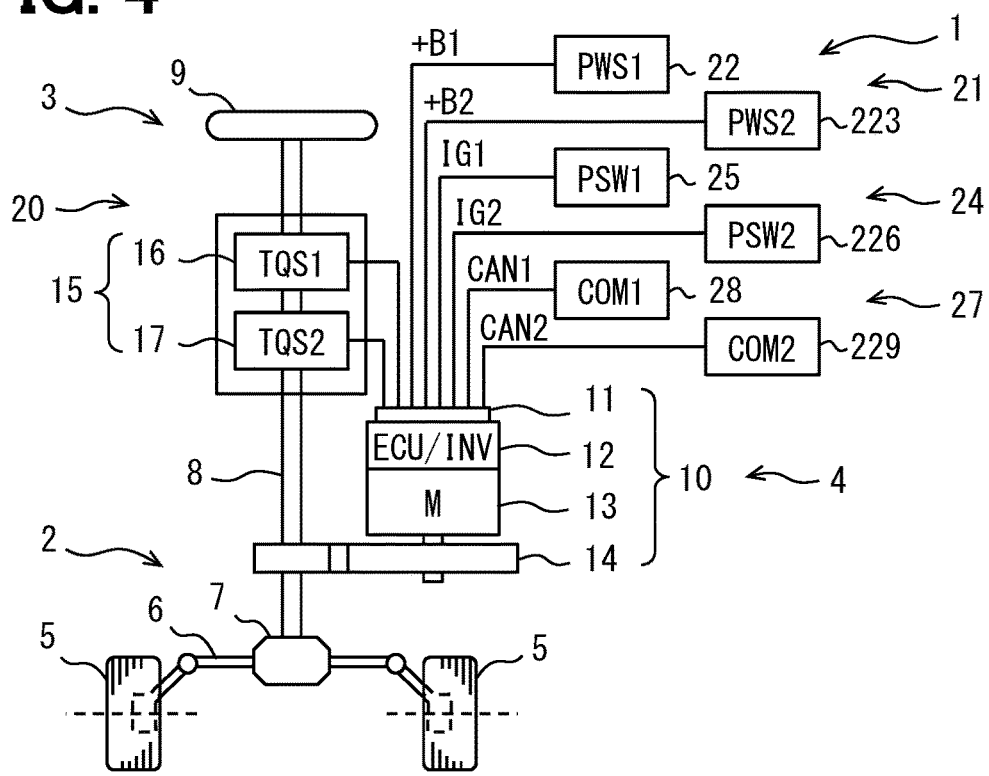
FIG. 4 is a block diagram of a system according to a second embodiment.

In FIG. 4, the power supply system 21 includes a power supply device (PWS1) 22 and a power supply device (PWS2) 223. The operation switch system 24 includes an operation switch device (PSW1) 25 and an operation switch device (PSW2) 226. The communication system 27 has a communication line (COM1) 28 and a communication line (COM2) 229. In this embodiment, all input systems constituting the electric steering device 1 are made redundant. Therefore, the electric steering device 1 in this embodiment is called a full redundancy system.

Figure 5:
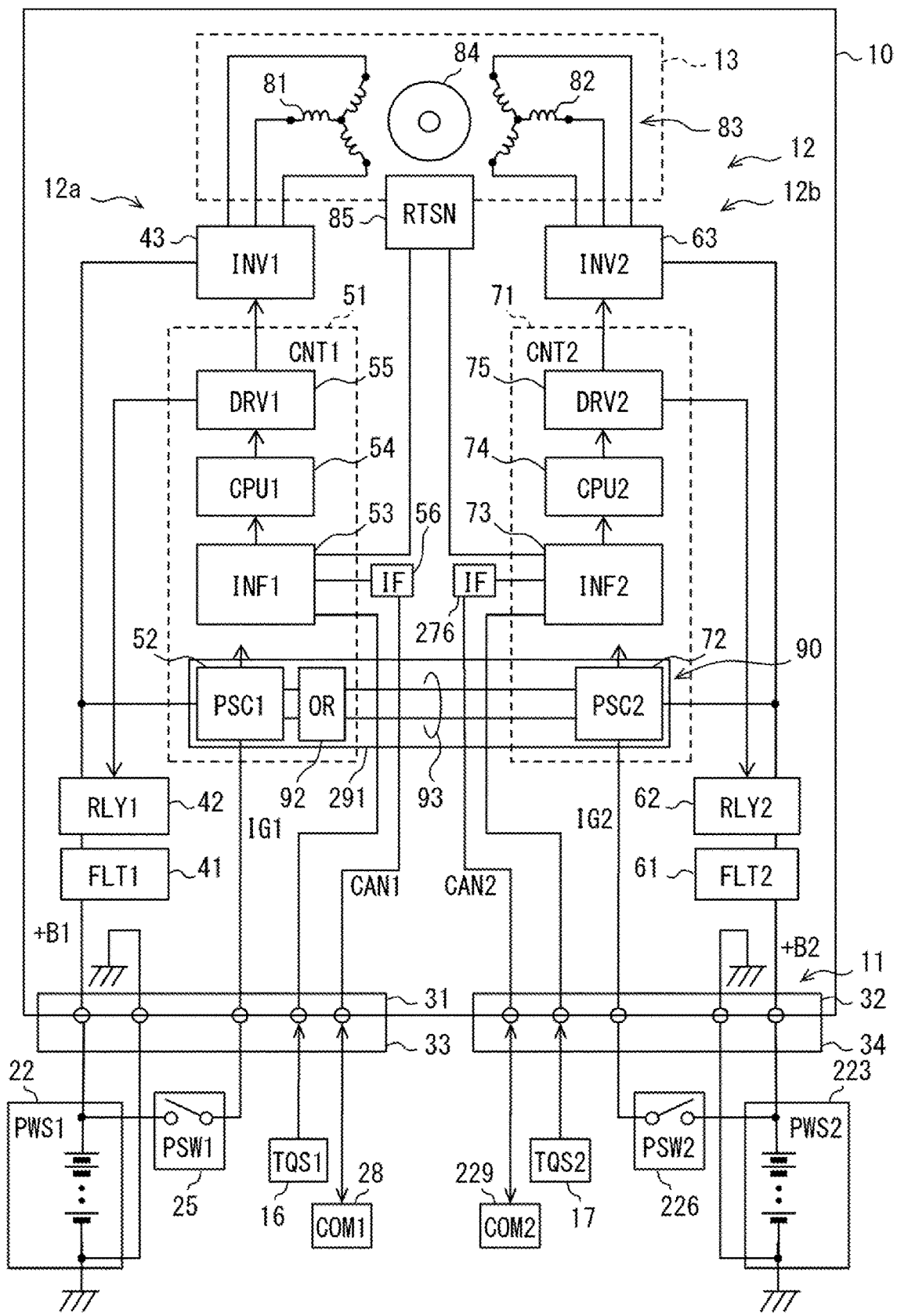
FIG. 5 is an electric block diagram of an electric driver device.

In FIG. 5, the torque sensor 16, the power supply device 22, the operation switch device 25, and the communication line 28 pass through connectors 31 and 33. The torque sensor 17, the power supply device 223, the operation switch device 226, and the communication line 229 pass through connectors 32 and 34. The communication data CAN1 of the communication line 28 passes through the communication interface circuit 56. The communication data CAN2 of the communication line 229 passes through the communication interface circuit 276.

Figure 6:
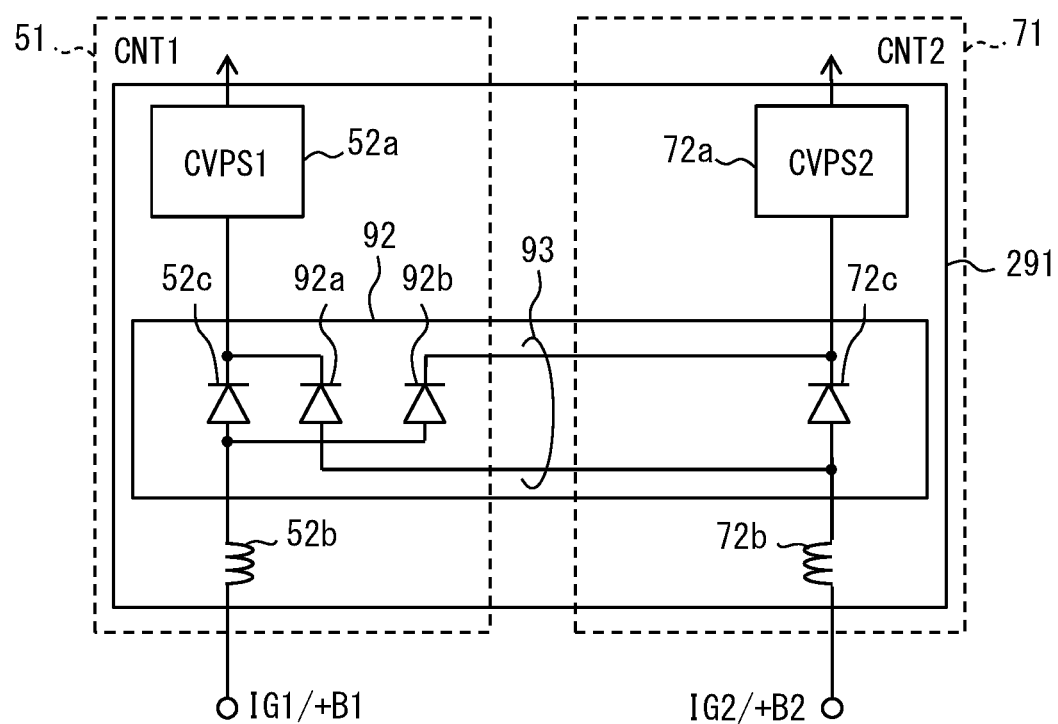
FIG. 6 is a circuit diagram of a power supply circuit.

In FIG. 6, the first power supply includes a first main power supply +B1 and a first operation switch signal IG1. The second power supply includes a second main power supply +B2 and a second operation switch signal IG2. The common power supply circuit 291 receives a first power supply and a second power supply. The common power supply circuit 291 provides a connection line 93 in the OR circuit 92 so that the first power supply and the second power supply can complement each other. Therefore, the electric driver device 10 in this embodiment is a partial redundancy system.

Also in this embodiment, the partial redundancy system provides high reliability. Further, the common circuit 90 enables to complement supply power each other while allowing the power supply system to be redundant, thereby providing an efficient circuit.

Third Embodiment

This embodiment is a modification based on the preceding first embodiment. In the first embodiment, the electric driver device 10 includes a common power supply circuit 91. Alternatively, in this embodiment, the electric driver device 10 includes a common interface circuit 391 as a common circuit 90.

Figure 7:
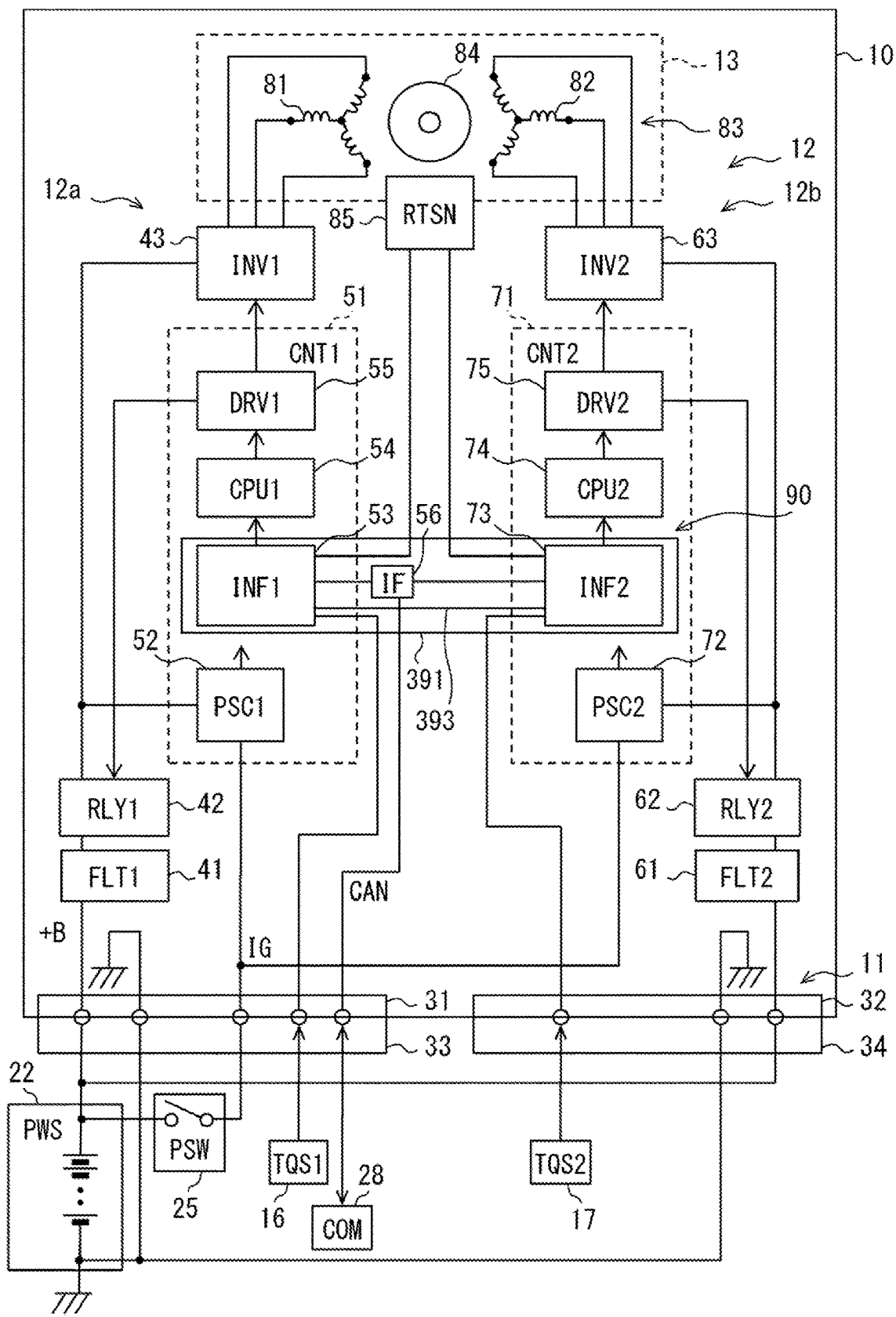
FIG. 7 is a block diagram of an electric driver device according to a third embodiment.

In FIG. 7, the electric driver device 10 includes the common circuit 90. The common circuit 90 includes a common interface circuit 391. The common interface circuit 391 complements a part of input/output signals between the control device 51 and the control device 71. The common interface circuit 391 includes a connection line 393 for complementing a part of signals with each other. The connection line 393 includes a plurality of signal lines to enable data communication.

Figure 8:
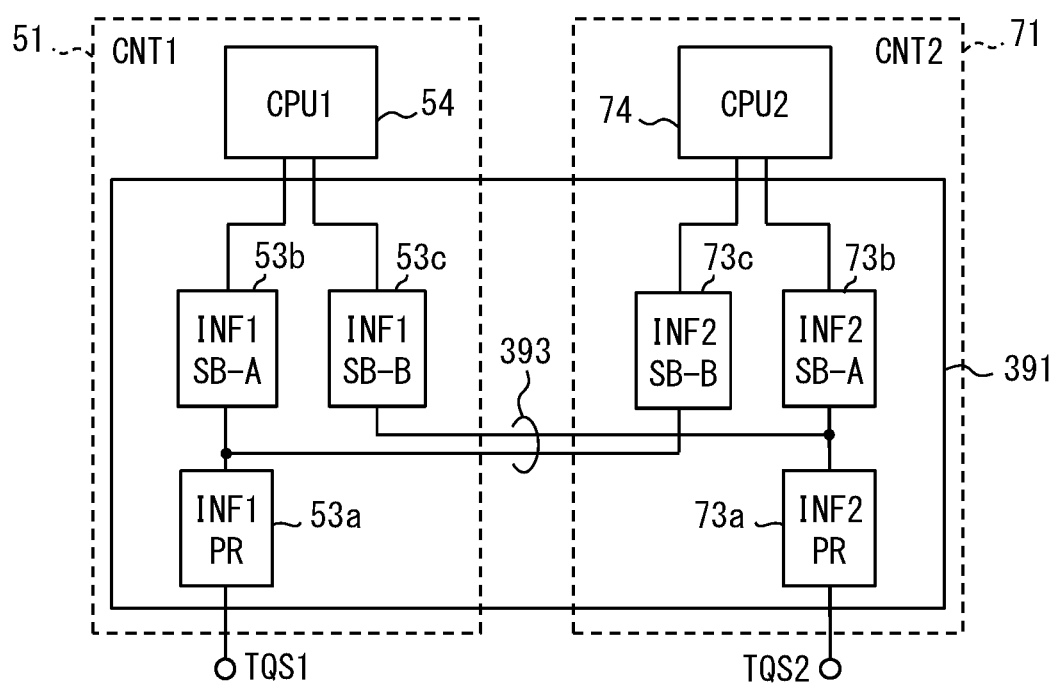
FIG. 8 is a circuit diagram of an input circuit.

FIG. 8 illustrates a part of the common interface circuit 391. The common interface circuit 391 has a circuit for processing signals from the torque sensors 16 and 17. The common interface circuit 391 complements the signals TQS1 and TQS2 between the control device 51 and the control device 71.

The common interface circuit 391 has a pre-stage interface circuit (INF1 PR) 53a and a post-stage interface circuit (INF1 SB-A) 53b for the signal TQS1 from the torque sensor 16. The signal TQS1 from the torque sensor 16 is processed into a signal that can be input to the arithmetic processing unit circuit 54 by passing through both the pre-stage interface circuit 53a and the post-stage interface circuit 53b.

The common interface circuit 391 has a pre-stage interface circuit (INF2 PR) 73a and a post-stage interface circuit (INF2 SB-A) 73b for the signal TQS2 from the torque sensor 17. The signal TQS2 from the torque sensor 17 is processed into a signal that can be input to the arithmetic processing unit circuit 74 by passing through both the pre-stage interface circuit 73a and the post-stage interface circuit 73b.

Further, the common interface circuit 391 has a connection line 393 for introducing an intermediate signal in the control device 71 to the control device 51. The signal from the pre-stage interface circuit 73a of the control device 71 is input to the arithmetic processing unit circuit 54 after passing through the connection line 393 and the post-stage interface circuit (INF1 SB-B) 53c. The common interface circuit 391 enables one arithmetic processing unit circuit 54 to supply both the signal TQS1 and the signal TQS2.

Further, the common interface circuit 391 has a connection line 393 for introducing an intermediate signal in the control device 51 to the control device 71. The signal from the pre-stage interface circuit 53a of the control device 51 is input to the arithmetic processing unit circuit 74 after passing through the connection line 393 and the post-stage interface circuit (INF2 SB-B) 73c. The common interface circuit 391 enables one arithmetic processing unit circuit 74 to supply both the signal TQS1 and the signal TQS2.

In this embodiment, the input/output signals include the first input signal TQS1 belonging to the one circuit system 12a and the second input signal TQS2 belonging to the other circuit system 12b. The common interface circuit 391, which is the common circuit 90, includes a first pre-stage interface circuit 53a that processes and outputs a first input signal. The common interface circuit 391 further includes a first post-stage interface circuit 53b that further processes the output of the first pre-stage interface circuit 53a and outputs the processed output to the arithmetic processing unit circuit 54 belonging to the one circuit system 12a. The common interface circuit 391 includes a second pre-stage interface circuit 73a that processes and outputs a second input signal. The common interface circuit 391 further includes a second post-stage interface circuit 73b that further processes the output of the second pre-stage interface circuit 73a and outputs the output to the arithmetic processing unit 74 belonging to the other circuit system 12b. The common interface circuit 391 further includes a third post-stage interface circuit 53c that further processes the output of the second pre-stage interface circuit 73a and outputs the processed output to the arithmetic processing unit circuit 54 belonging to the one circuit system 12a. The common interface circuit 391 further includes a fourth post-stage interface circuit 73c that further processes the output of the first pre-stage interface circuit 53a and outputs the output to the arithmetic processing unit circuit 74 belonging to the other circuit system 12b.

Figure 9:
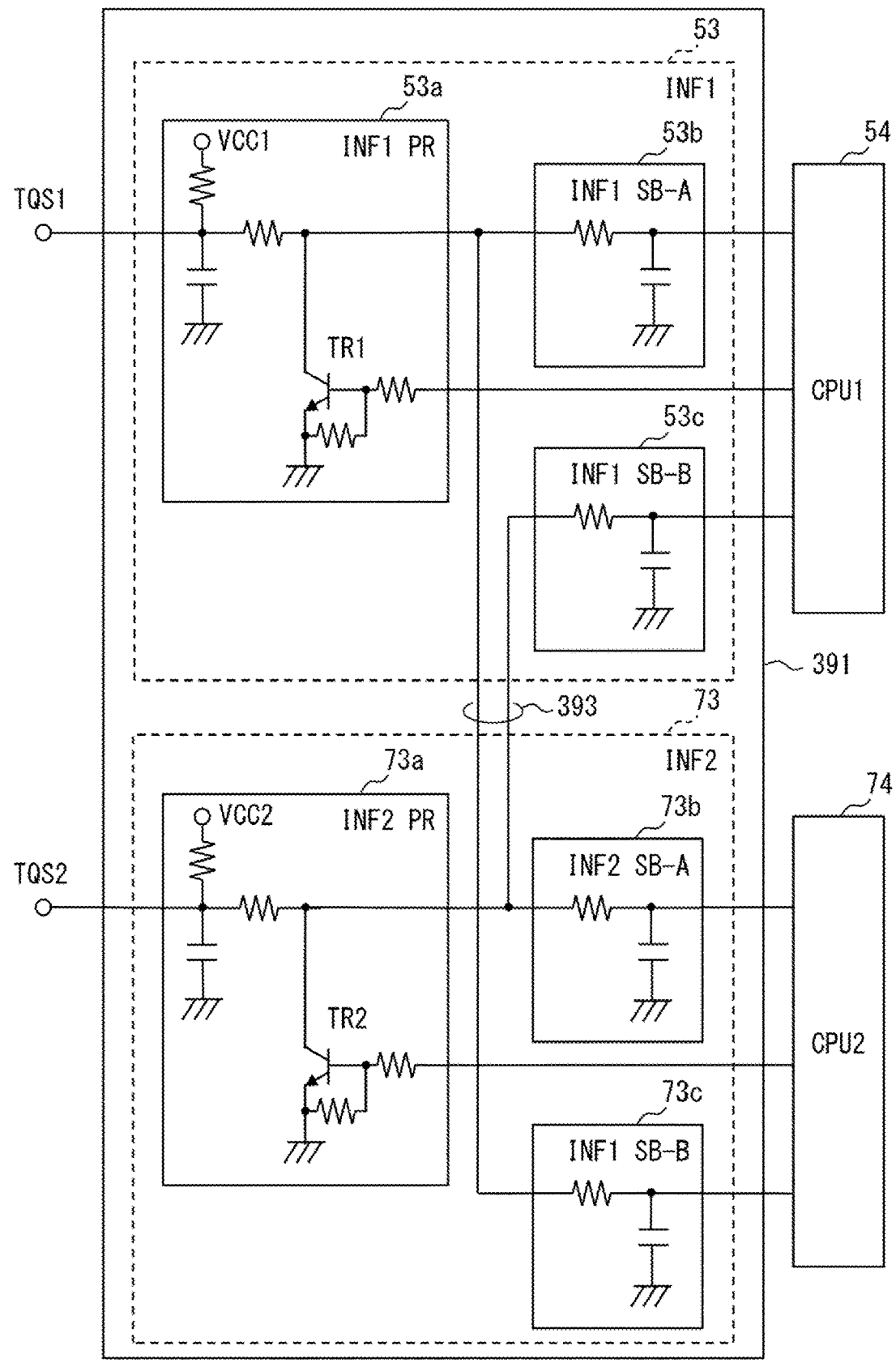
FIG. 9 is a circuit diagram of an input circuit.

FIG. 9 shows a specific circuit of the common interface circuit 391. The pre-stage interface circuit 53a is a low-pass filter circuit having a control transistor TR1. The pre-stage interface circuit 73a is a low-pass filter circuit having a control transistor TR2. The post-stage interface circuit 53b is a low-pass filter circuit. The post-stage interface circuit 73b is a low-pass filter circuit. The post-stage interface circuit 53c is a low-pass filter circuit. The post-stage interface circuit 73c is a low-pass filter circuit. The post-stage interface circuits 53b, 73b, 53c, 73c prevent a propagation of a failure when corresponding ports of the arithmetic processing unit circuit 54 and 74 has a failure.

Figure 10:
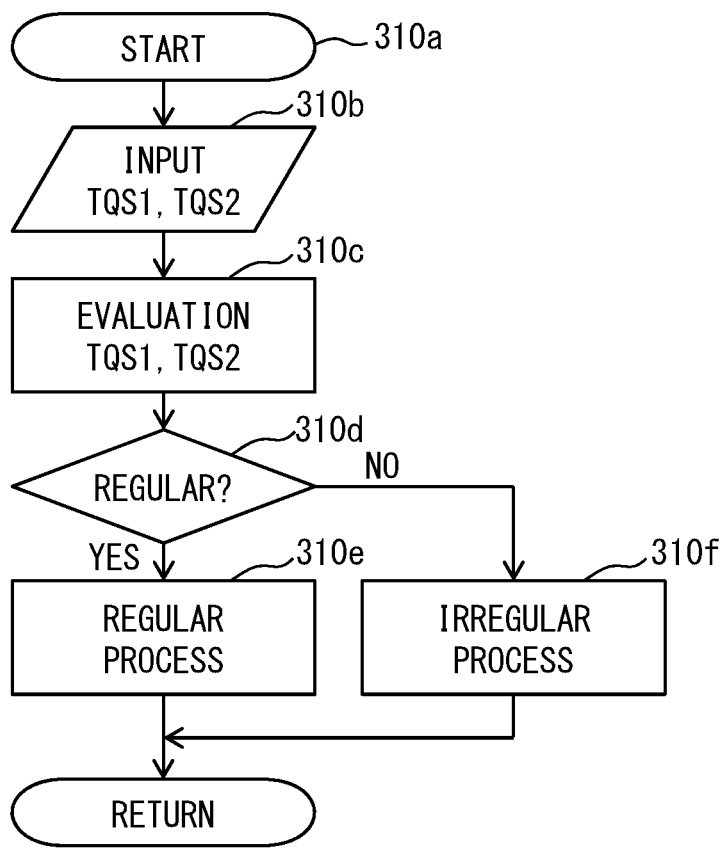
FIG. 10 is a flowchart showing control processing.

FIG. 10 illustrates an example of the control processing 310a in the arithmetic processing unit circuits 54 and 74. Each of the arithmetic processing unit circuits 54 and 74 executes a control process 310a. That is, the control process 310a is executed by the arithmetic processing unit circuit 54. At the same time, the control processing 310a is executed in the arithmetic processing unit circuit 74. In step 310b, the arithmetic processing unit circuit inputs the signals TQS1 and TQS2. In step 310c, the arithmetic processing unit circuit evaluate the signals TQS1 and TQS2. The arithmetic processing unit circuit evaluates, for example, a signal to be input according to a circuit system. The signal TQS1 of the torque sensor 16 may include two signal components. In this case, the arithmetic processing unit circuit 54 evaluates the signal TQS1 based on the two signal components. The signal TQS2 of the torque sensor 17 may include two signal components. In this case, the arithmetic processing unit circuit 74 evaluates the signal TQS2 based on the two signal components. Alternatively, the arithmetic processing unit circuit may evaluate the signals TQS1 and TQS2 by comparing the signals TQS1 and TQS2. The evaluation in step 310c is an evaluation for determining an abnormality of the torque sensor. In step 310d, the arithmetic processing unit circuit determines whether both the torque sensor 16 and the torque sensor 17 are normal. If it is determined in step 310d that the data is normal, the process branches to YES. If it is determined in step 310d that the state is not normal (abnormal), the process branches to NO.

In step 310e, the arithmetic processing unit circuit executes a pre-programmed normal process. The arithmetic processing unit circuits 54 and 74 execute the control processing in accordance with, for example, only a predetermined signal. The arithmetic processing unit circuits 54 and 74 may execute control processing according to both signals, for example.

In step 310e, the arithmetic processing unit circuit executes a pre-programmed abnormal process. The arithmetic processing unit circuits 54 and 74 specify, for example, a torque sensor estimated to be abnormal. The arithmetic processing unit circuits 54 and 74 execute control processing using the signal of the other normal torque sensor without using the signal of the torque sensor estimated to be abnormal, for example.

In this embodiment, the common interface circuit 391 is configured to complement at least a part of each other's input/output signals in the two control devices 51 and 71. The connection line 393 is connected so as to complement the input/output signals. Therefore, even if one of the input/output signals becomes abnormal, the other input/output signal can prevent one of the two control devices 51 and 71 from executing abnormal arithmetic processing. The common circuit 90 provides a circuit. The circuit makes the two I/O circuits as a set of circuit, and to complement each other, while without independently separating them each other. The partial redundancy system provides high reliability. Further, the common circuit 90 enables to complement supply power each other while allowing the power supply system to be redundant, thereby providing an efficient circuit.

Fourth Embodiment

This embodiment is a modification based on the preceding embodiment. In the third embodiment, a common interface circuit 391 is employed in the partial redundancy system. Alternatively, in this embodiment, a common interface circuit is employed in the full redundancy system.

Figure 11:
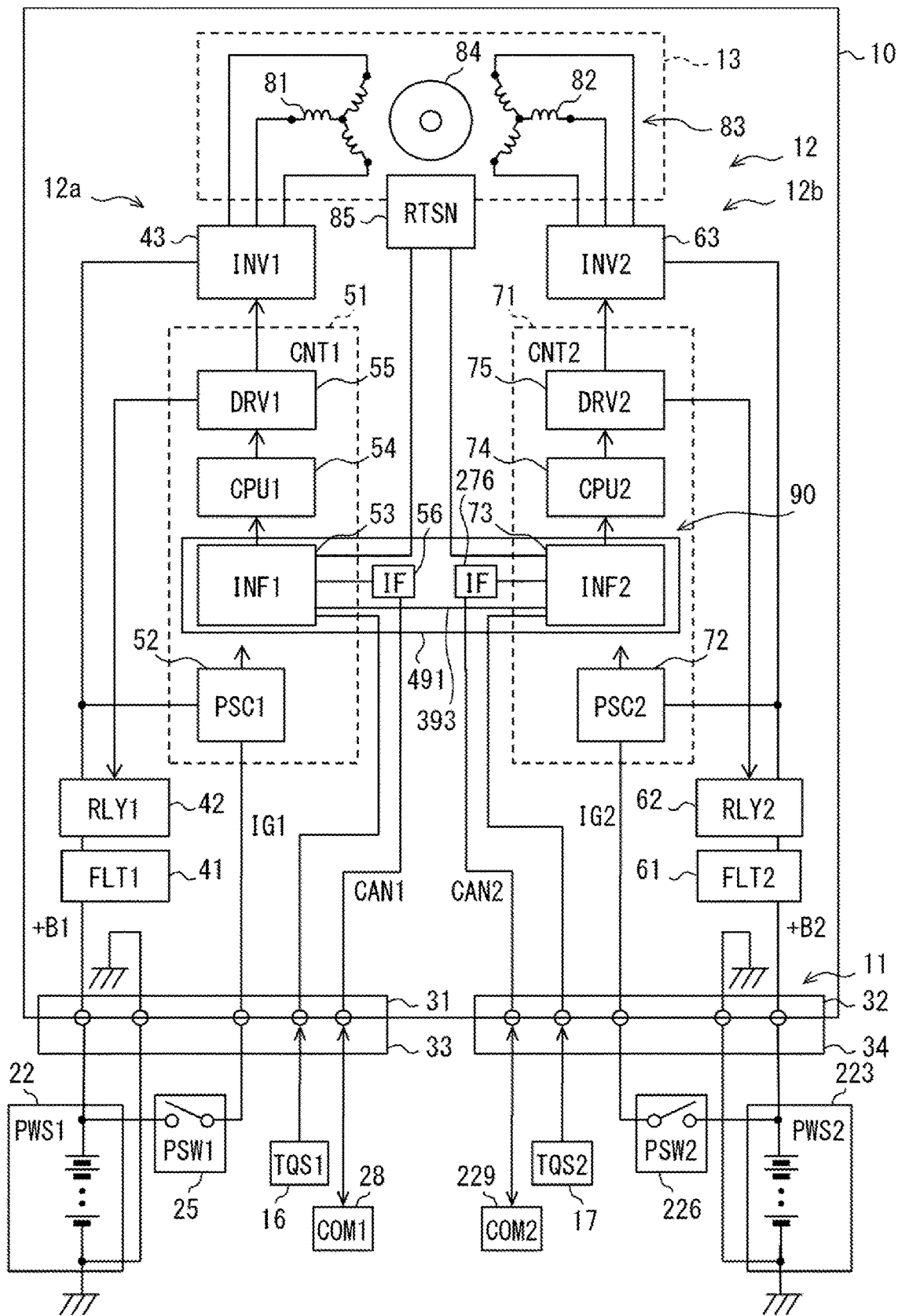
FIG. 11 is a block diagram of an electric driver device according to a fourth embodiment.

In FIG. 11, the common circuit 90 includes a common interface circuit 491. The connection line 393 is the same as in the previous embodiment. The common interface circuit 491 includes a communication interface circuit 276. Also in this embodiment, the highly reliable electric driver device 10 is provided by the common interface circuit 491.

Fifth Embodiment

This embodiment is a modification based on the preceding embodiment. In a plurality of the above embodiments, the electric driver device 10 includes two connectors 31 and 32. Alternatively, a single connector is employed in this embodiment.

Figure 12:
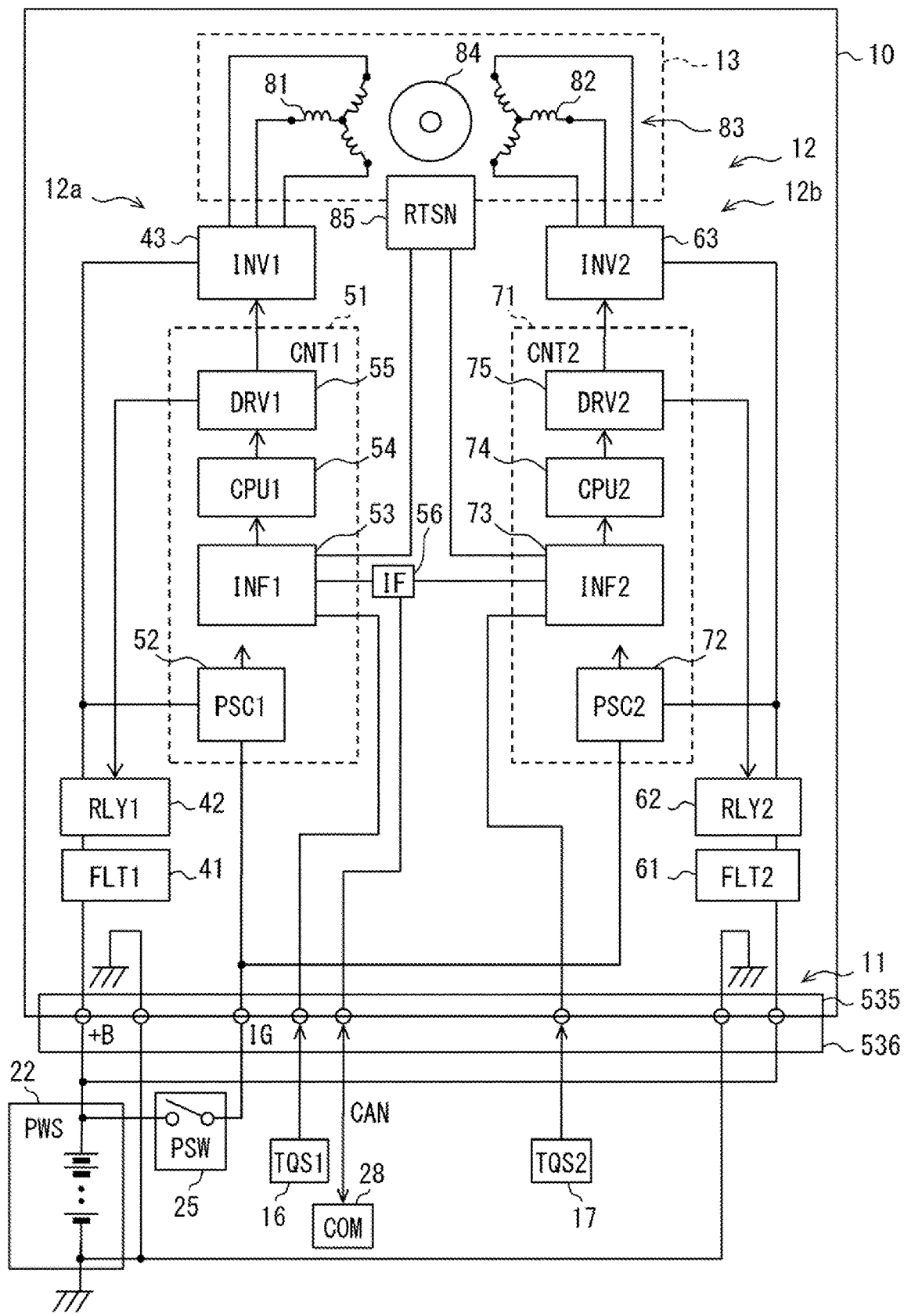
FIG. 12 is a block diagram of an electric driver device according to a fifth embodiment.

In FIG. 12, the connector 11 is provided by a single connector including a device-side connector 535 and a vehicle-side connector 536.

Figure 13:
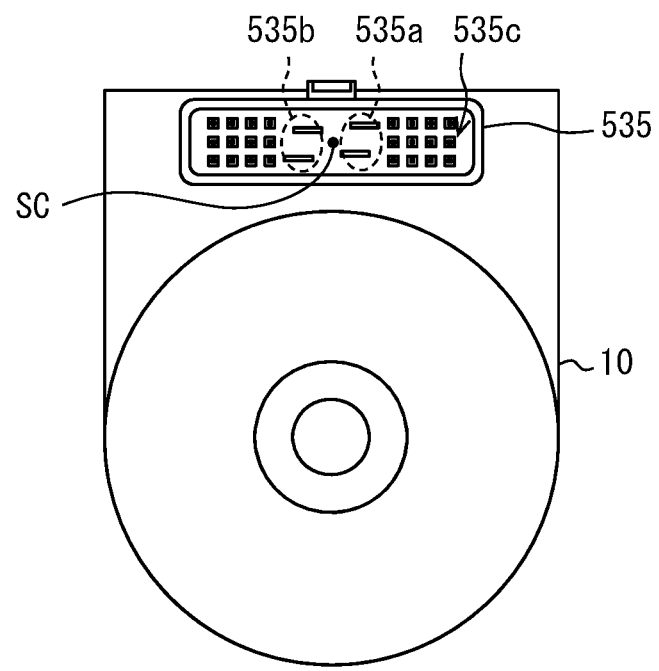
FIG. 13 is a plan view showing a connector of an electric driver device.

In FIG. 13, the arrangement of the electrodes in the connector 535 is illustrated. The connector 535 has two groups of electrodes 535a and 535b for the main power supply +B that is branched into two outside the electric driver device 10. The group of electrodes 535a includes, for example, two electrodes as a positive electrode and a negative electrode. The two groups of electrodes 535a and 535b are symmetrically arranged with respect to a point symmetry center SC of the connector 535. The two groups of electrodes 535a, 535b may be arranged asymmetrically with respect to the point symmetry center SC of the connector 535. The connector 535 has a plurality of signal electrodes 535c. The electrodes 535c are arranged asymmetrically with respect to the point symmetry center SC of the connector 535. The connector 11 is not independently separated for each of a plurality of circuit systems. A plurality of electrodes for the redundant torque sensor signals TQS1 and TQS2 are mixedly arranged on one common connector 535. If the connectors 535 and 536 are assembled in the wrong direction, the control devices 51 and 71 cannot obtain expected signals. Therefore, erroneous assembly in the connectors 535 and 536 is easily revealed.

According to this embodiment, an odd number of connectors 535 having a plurality of electrodes for connecting the main power supply +B and a plurality of input/output signals are provided. The electric circuit 12 is made redundant. Therefore, the reliability of the electric driver device 10 including the electric circuit 12 is improved. On the other hand, the odd-number of connector 535 enables more efficient connection of the power supply and the plurality of input/output signals to the plurality of circuit systems 12a and 12b.

According to this embodiment, the connector 11 is not independently separated. The plurality of electrodes 535a, 535b and 535c included in the connector 11 are mixedly arranged in one connector housing. Moreover, since the plurality of electrodes 535c are arranged asymmetrically with respect to the point symmetry center SC of the connector 535, erroneous assembly is easily revealed.

Sixth Embodiment

This embodiment is a modification based on the preceding embodiment. In the fifth embodiment, a single connector is employed in the partial redundancy system. Alternatively, in this embodiment, a single connector is employed in a full redundancy system.

Figure 14:
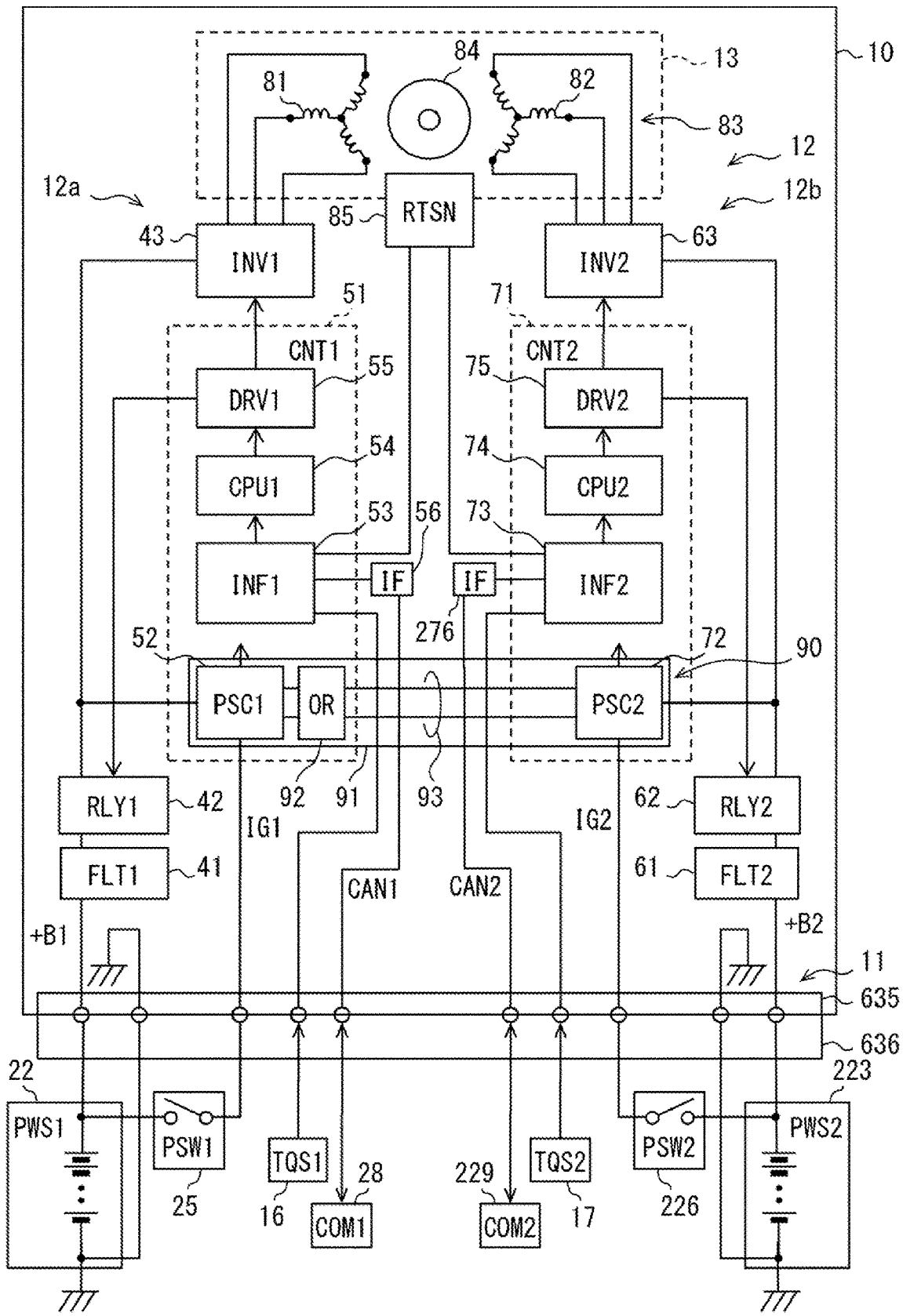
FIG. 14 is a block diagram of an electric driver device according to a sixth embodiment.

In FIG. 14, the connector 11 is provided by a single connector including a device-side connector 635 and a vehicle-side connector 636. Also in this embodiment, the connector 11 is not independently separated. The electrodes for the redundant power supplies +B1 and +B2 are mixedly arranged on one common connector 635. The electrodes for the redundant operation switch signals IG1 and IG2 are mixedly arranged on one common connector 635. The electrodes for the redundant torque sensor signals TQS1 and TQS2 are mixedly arranged on one common connector 635. The electrodes for redundant communication data CAN1 and CAN2 are mixedly arranged on one common connector 635. Also in this embodiment, the plurality of electrodes are arranged asymmetrically on the connector 635. Therefore, erroneous assembly in the connector 11 can be easily revealed.

Seventh Embodiment

This embodiment is a modification based on the preceding embodiment. In the first embodiment, a common power supply circuit 91 including the OR circuit 92 is employed. Alternatively, in this embodiment, a common power supply circuit 791 to which a power supply is directly connected is employed.

Figure 15:
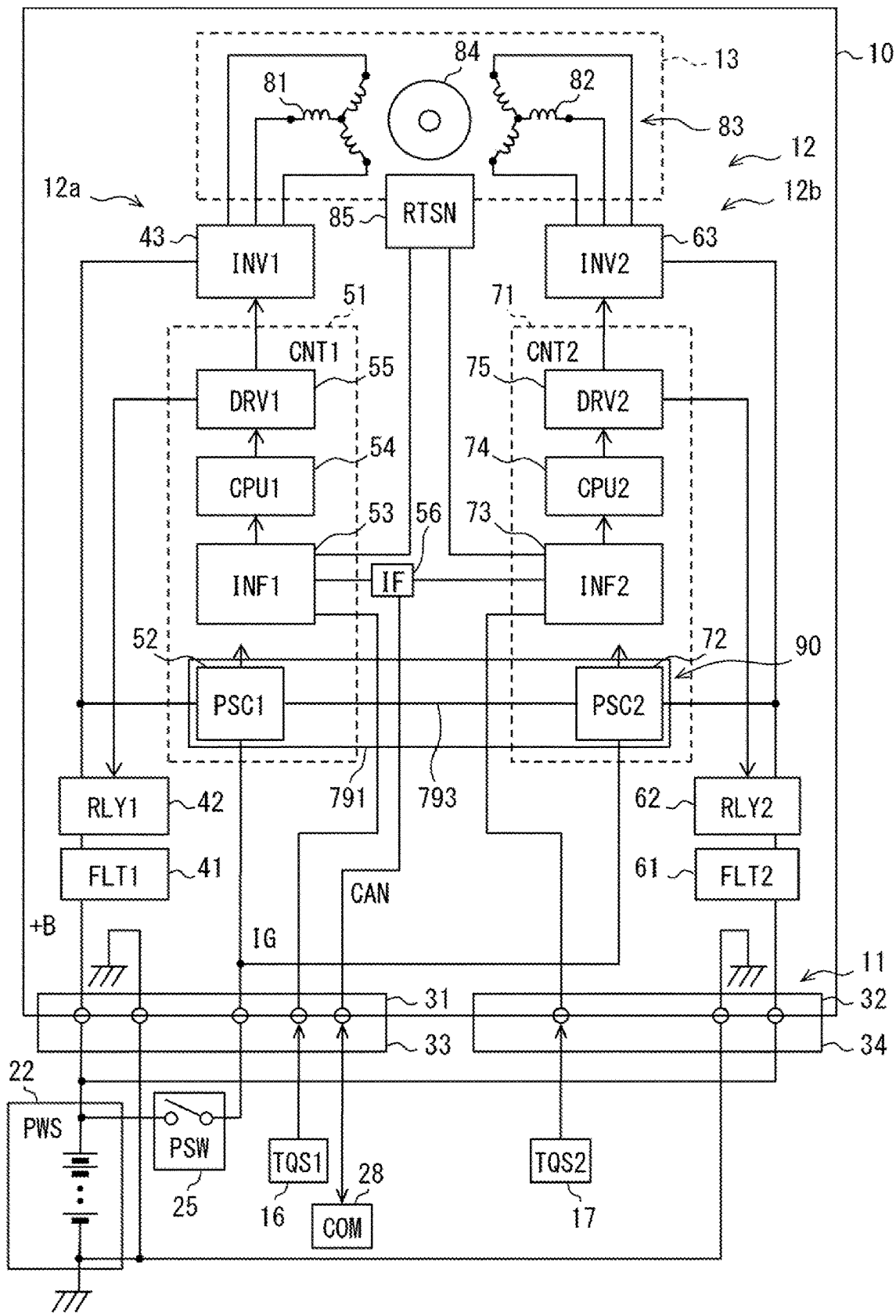
FIG. 15 is a block diagram of an electric driver device according to a seventh embodiment.

In FIG. 15, the common circuit 90 is provided by a common power supply circuit 791. The common power supply circuit 791 includes a connection line 793.

Figure 16:
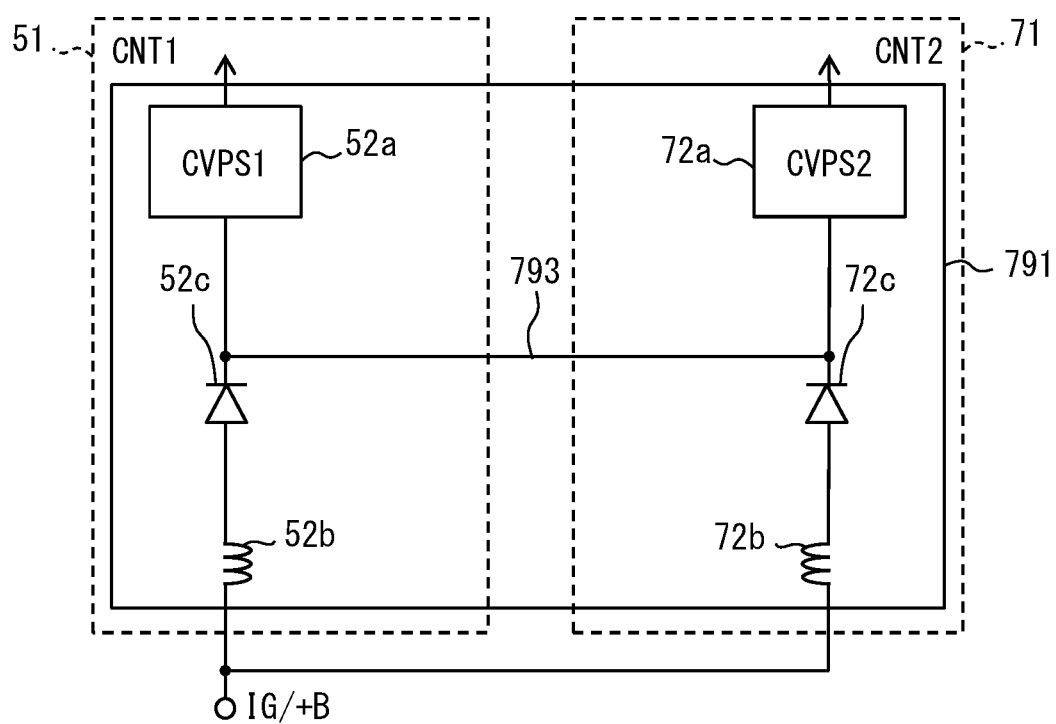
FIG. 16 is a circuit diagram of a power supply circuit.

FIG. 16 shows a detailed circuit of the common power supply circuit 791. The connection line 793 directly connects the cathode of the diode element 52c for preventing reverse connection and the cathode of the diode element 72c. Also in this embodiment, the common power supply circuit 791 is configured to complement the power supply by a set of circuit without independently separating the two power supply circuits. The connection line 793 is connected so as to complement the power supplies. Also in this embodiment, high reliability can be realized. The connection line 793 provides a wired-OR circuit.

Note that the common power supply circuit 791 may be employed in a full redundancy system. The common power supply circuit 791 may be employed, for example, instead of the common power supply circuit 291 in the second embodiment.

Eighth Embodiment

This embodiment is a modification based on the preceding embodiment. In the third embodiment, the common interface circuit 391 is employed. Alternatively, a common interface circuit 891 is employed in this embodiment.

Figure 17:
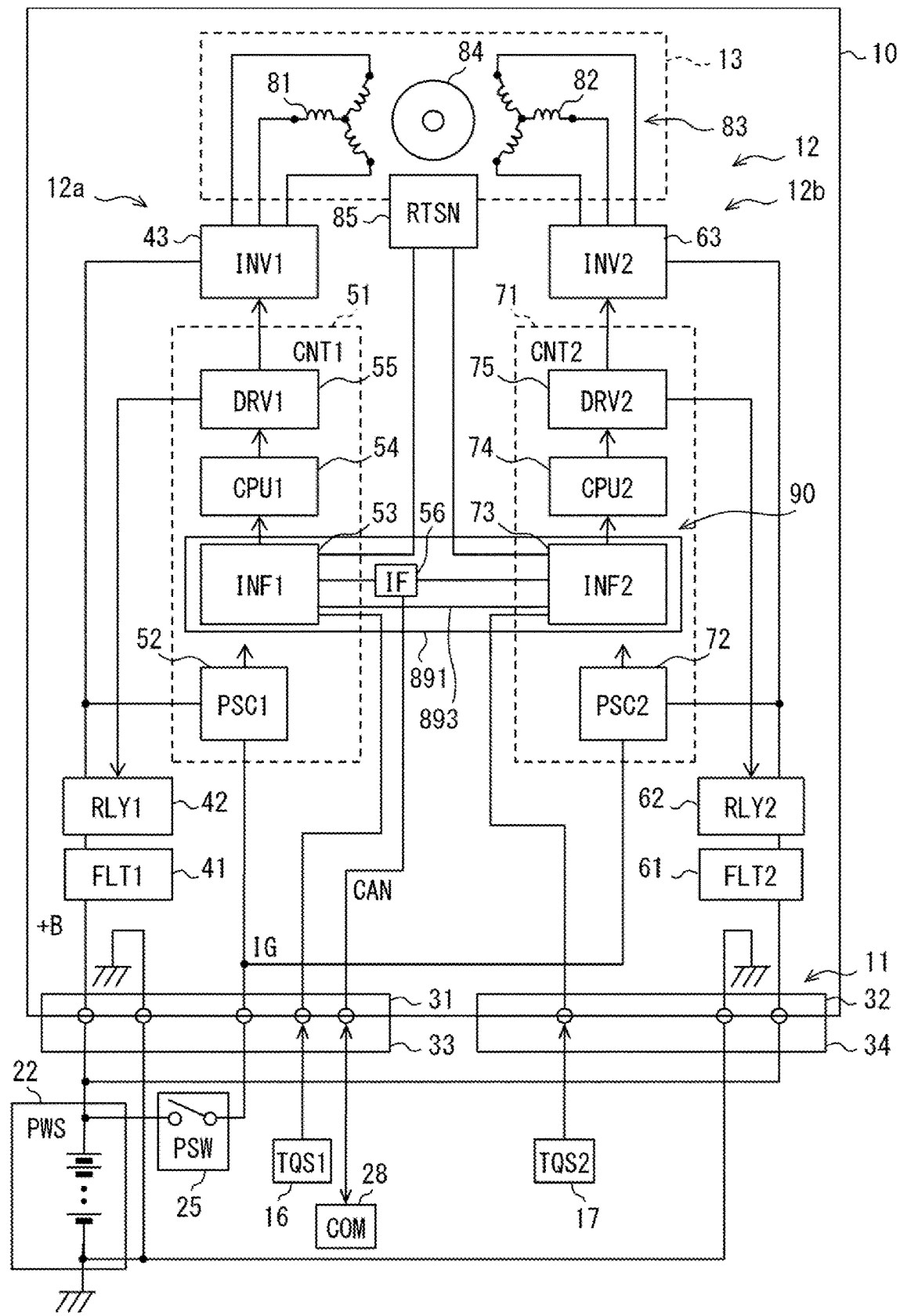
FIG. 17 is a block diagram of an electric driver device according to an eighth embodiment.

In FIG. 17, the common circuit 90 is provided by a common interface circuit 891. The common interface circuit 891 includes a connection line 893.

Figure 18:
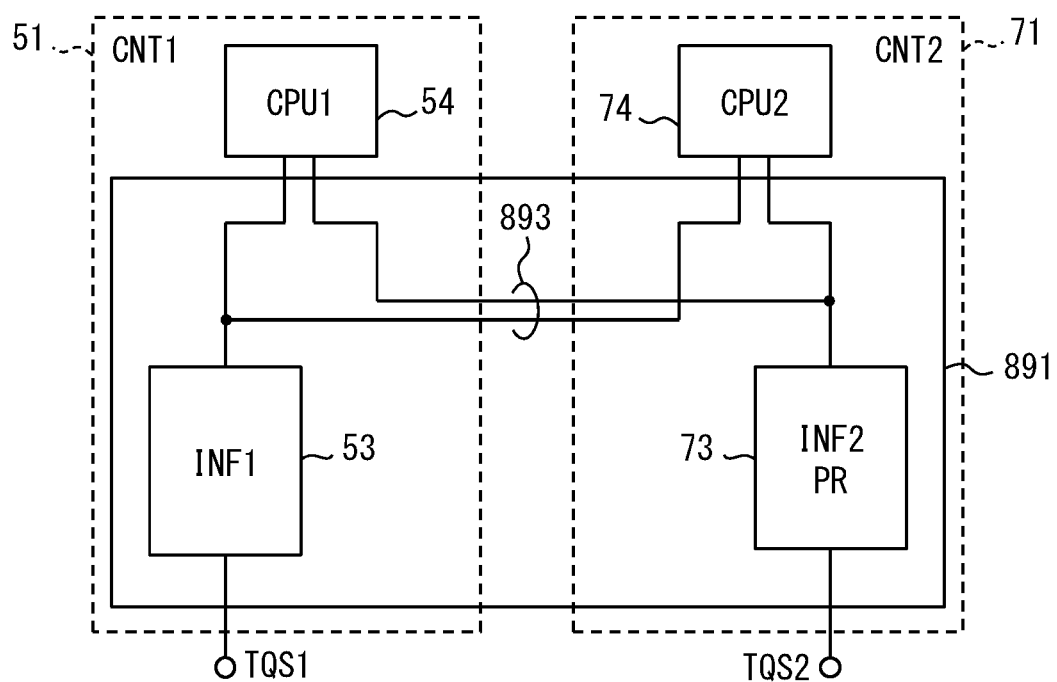
FIG. 18 is a circuit diagram of an input circuit.

FIG. 18 shows a detailed circuit of the common interface circuit 891. The connection lines 893 are wired so that the input signal passed through the interface circuit 53 and the input signal passed through the interface circuit 73 complement each other. The connection lines 893 are connected so as to complement the input/output signals. The arithmetic processing unit circuit 54 acquires both the input signal via the interface circuit 53 and the input signal via the interface circuit 73. The arithmetic processing unit circuit 74 acquires both the input signal via the interface circuit 53 and the input signal via the interface circuit 73. Also in this embodiment, the control processing 310a of the third embodiment may be used. Also in this embodiment, the common interface circuit 891 is configured to complement the input signals by a set of circuit without independently separating the two I/O circuits. Also in this embodiment, high reliability can be realized.

Ninth Embodiment

This embodiment is a modification based on the preceding embodiment. In the fourth embodiment, the common interface circuit 491 is employed. Alternatively, a common interface circuit 991 is employed in this embodiment.

Figure 19:
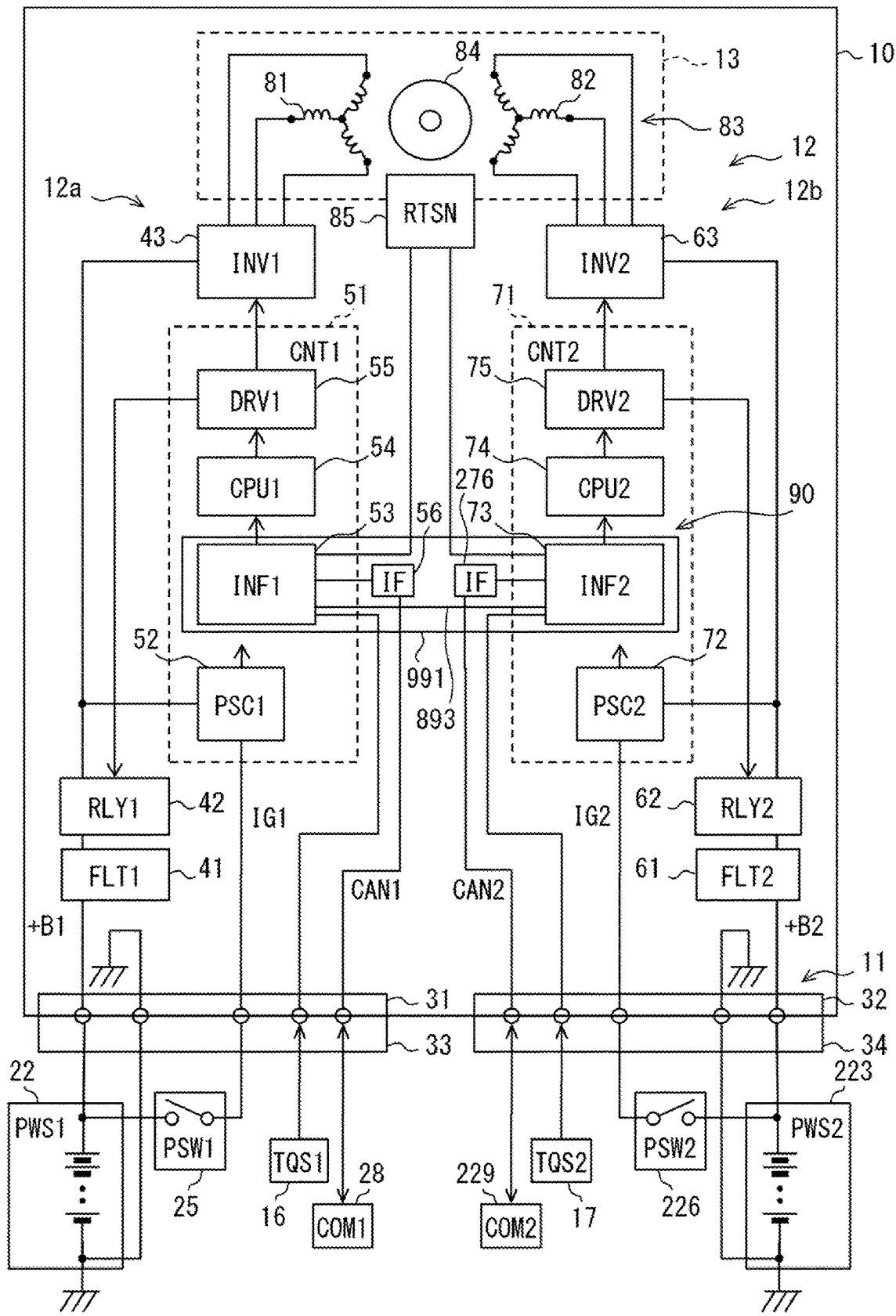
FIG. 19 is a block diagram of an electric driver device according to a ninth embodiment.

In FIG. 19, the common circuit 90 is provided by a common interface circuit 991. The common interface circuit 991 includes the connection line 893. In this embodiment, the electric steering device 1 provides a full redundancy system. Therefore, the common interface circuit 991 includes a communication interface circuit 276 for the second communication line 229. Also in this embodiment, the common interface circuit 991 is configured to complement the input signals by a set of circuit without independently separating the two I/O circuits. Also in this embodiment, high reliability can be realized.

Tenth Embodiment

This embodiment is a modification based on the preceding embodiment. In the embodiments described above, the power cutoff circuit 42 and the power cutoff circuit 62 are employed. Alternatively, in this embodiment, a common power cutoff circuit A91 is employed.

Figure 20:
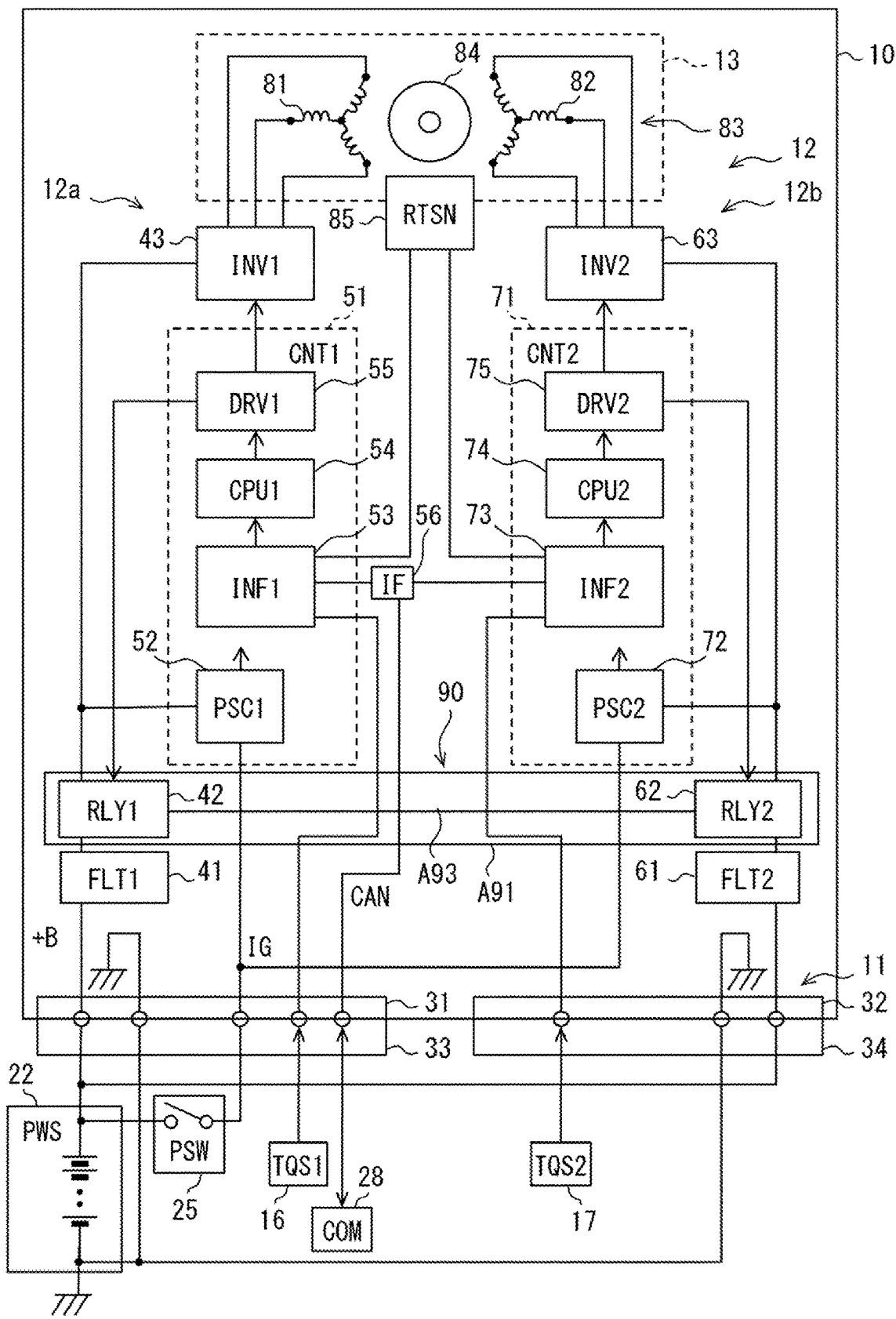
FIG. 20 is a block diagram of an electric driver device according to a tenth embodiment.

In FIG. 20, the common circuit 90 is provided by a common power cutoff circuit A91. The common power cutoff circuit A91 is a circuit common to the first circuit system and the second circuit system. The common power cutoff circuit A91 includes a connection line A93.

Figure 21:
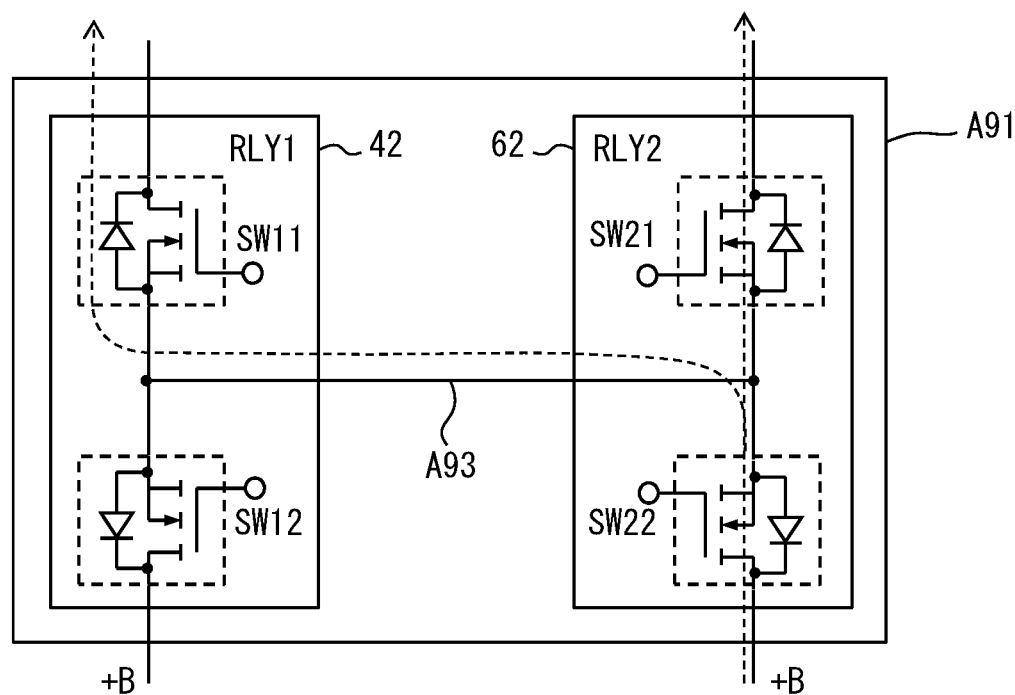
FIG. 21 is a circuit diagram of a power cutoff circuit.

FIG. 21 shows a detailed circuit of the common power cutoff circuit A91. The common power cutoff circuit A91 includes two switching elements SW11 and SW12 as the power cutoff circuit 42. The switching elements SW11 and SW12 allow input of the main power supply +B when turned on. The switching elements SW11 and SW12 cut off the main power supply +B when turned off. The common power cutoff circuit A91 includes two switching elements SW21 and SW22 as a power cutoff circuit 62. The switching elements SW21 and SW22 allow input of the main power supply +B when turned on. The switching elements SW21 and SW22 cut off main power supply +B when turned off. The connection line A93 connects between the switching element SW11 and the switching element SW12 and between the switching element SW21 and the switching element SW22. The connection line A93 is connected so as to complement the power supplies.

When detecting any abnormality, the arithmetic processing unit circuit 54 controls the first power supply cutoff circuit 42 so as to cut off the main power supply +B. In this case, the switching elements SW11 and SW12 are controlled to be turned off. In this case, the connection line A93 and the parasitic diode of the switching element SW11 continue to supply the main power supply +B as indicated by the dashed arrow.

Also in this embodiment, the common power cutoff circuit A91 is configured to complement the main power supply +B with a set of circuit while the two power cutoff circuits are not independently separated. Also in this embodiment, high reliability can be realized.

Note that the common power cutoff circuit A91 may be employed in a full redundancy system. The common power cutoff circuit A91 may be employed in, for example, the second embodiment.

Eleventh Embodiment

This embodiment is a modification based on the preceding embodiment. In a plurality of the above embodiments, the electric driver device 10 includes two connectors 31 and 32 or one common connector 535 or 536. Alternatively, in this embodiment, a plurality of connectors in which a plurality of electrodes are grouped by function are employed.

Figure 22:
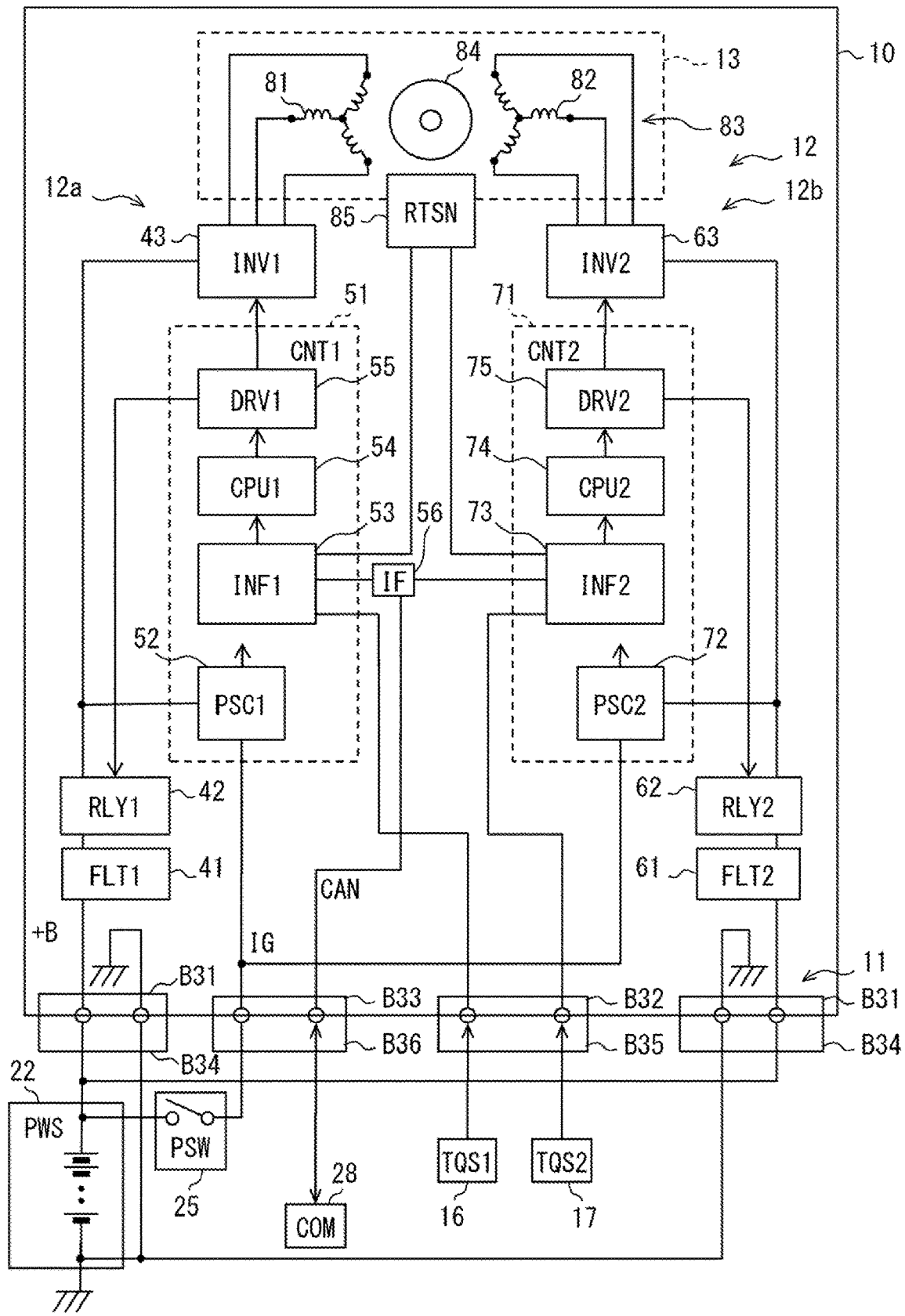
FIG. 22 is a block diagram of an electric driver device according to an eleventh embodiment.

In FIG. 22, the connector 11 is provided by three connectors 11 including connectors B31, B32 and B33 on the device side and connectors B34, B35 and B36 on the vehicle side. The connectors B31 and B34 have an electrode group for the main power supply +B. The connectors B31 and B34 are also called power connectors. The connectors B32 and B35 have an electrode group for the plurality of torque sensors 16 and 17. The connectors B32 and B35 are also called torque sensor connectors. The connectors B33 and B36 have an electrode group for a vehicle signal source including the operation switch device 25 and the communication line 28. The connectors B33 and B36 are also called vehicle signal connectors. The connector 11 forms different connectors for each signal function applied to the electrodes without being independently separated for each redundant circuit system.

Figure 23:
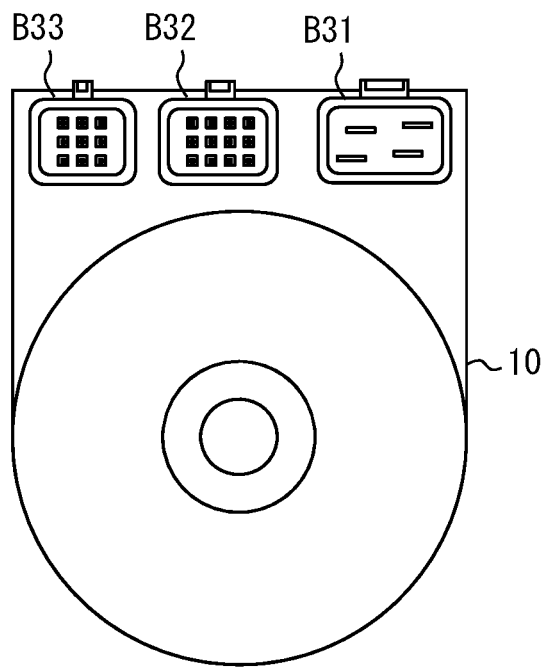
FIG. 23 is a plan view showing a connector of an electric driver device.

FIG. 23 illustrates the arrangement of the connectors B31, B32 and B33. These three connectors B31, B32 and B33 have different shapes. These three connectors B31, B32 and B33 have different numbers of electrodes. The connector 11 is not independently separated each other for each redundant circuit system. The plurality of connectors B31, B32 and B33 included in the connector 11 are separated in an odd number for each function. Therefore, erroneous assembly in the connectors 535 and 536 is easily revealed.

According to this embodiment, a high degree of freedom in electrode arrangement in the connector 11 can be provided. The high degree of freedom of the electrode arrangement makes it possible, for example, to connect the torque sensors 16, 17 and the connector B35 in an efficient manner without being disturbed by other signal lines. According to this embodiment, in the electric steering device 1 or the electric driver device 10, an efficient configuration can be provided by the connectors B31, B32, and B33 for each function while realizing high reliability. Also in this embodiment, the connectors B31, B32 and B33 provide an odd number of connectors.

The connectors B31, B32 and B33 may be employed in a full redundancy system. The connectors B31, B32 and B33 may be employed in, for example, the second embodiment.

Twelfth Embodiment

This embodiment is a modification based on the preceding embodiment. In the above embodiments, the electric driver device 10 includes the common circuit 90. Alternatively, in this embodiment, an asymmetric connector 11 is employed without providing the common circuit 90.

Figure 24:
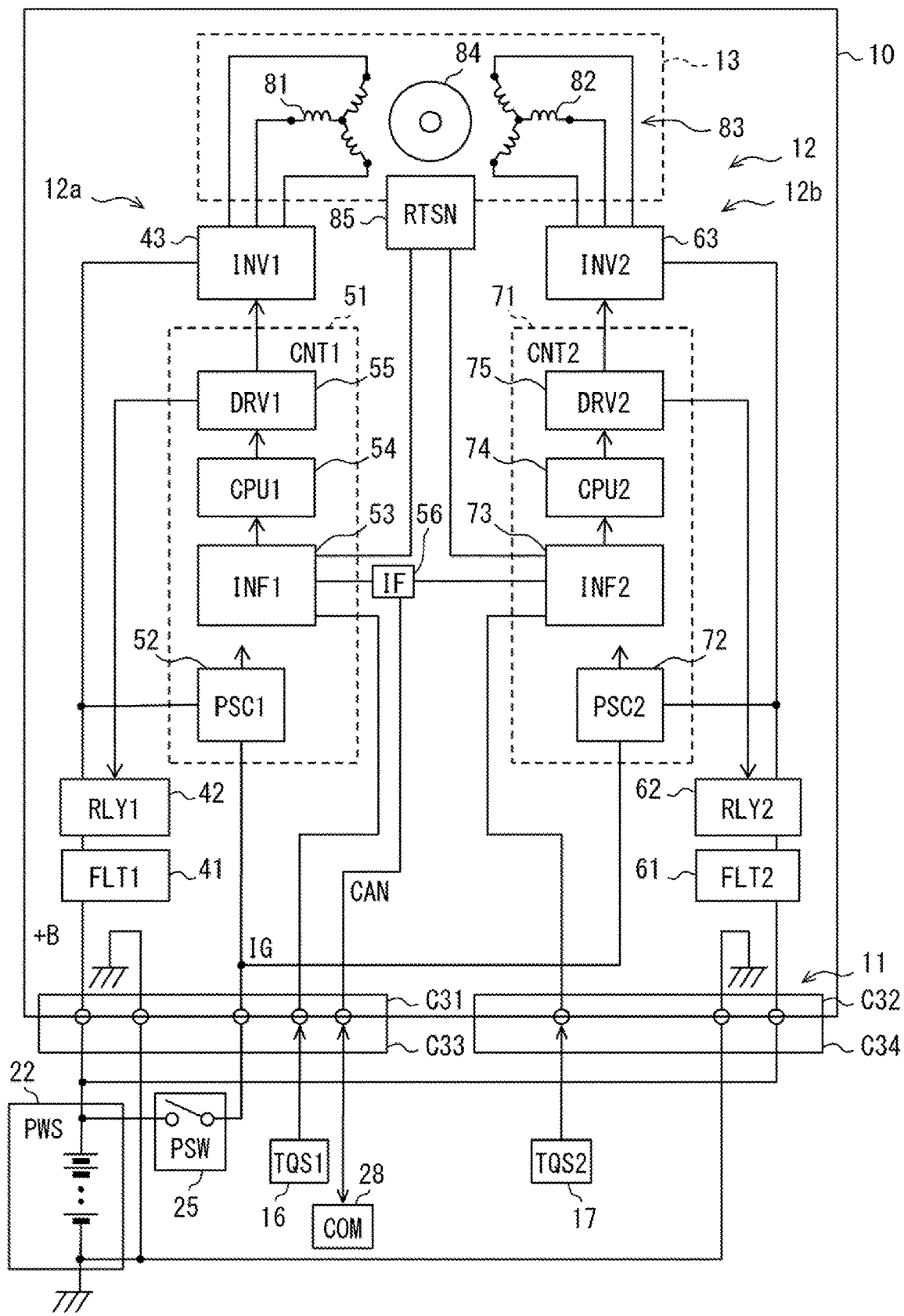
FIG. 24 is a block diagram of an electric driver device according to a twelfth embodiment.

In FIG. 24, the connector 11 includes device-side connectors C31 and C32 and vehicle-side connectors C33 and C34.

The first connectors C31 and C33 connect the signal of the operation switch device 25. The first connectors C31 and C33 connect signals of the communication line 28.

The second connectors C32 and C34 do not connect the signal of the operation switch device 25 and the signal of the communication line 28. In other words, the connectors C31 and C33 and the connectors C32 and C34 are asymmetric with respect to the presence or absence of a passing signal. Therefore, if the connectors C31 and C33 are erroneously connected to the connectors C32 and C34, the control devices 51 and 71 in a plurality of circuit systems cannot obtain expected signals. Therefore, an erroneous connection is easily revealed.

Figure 25:
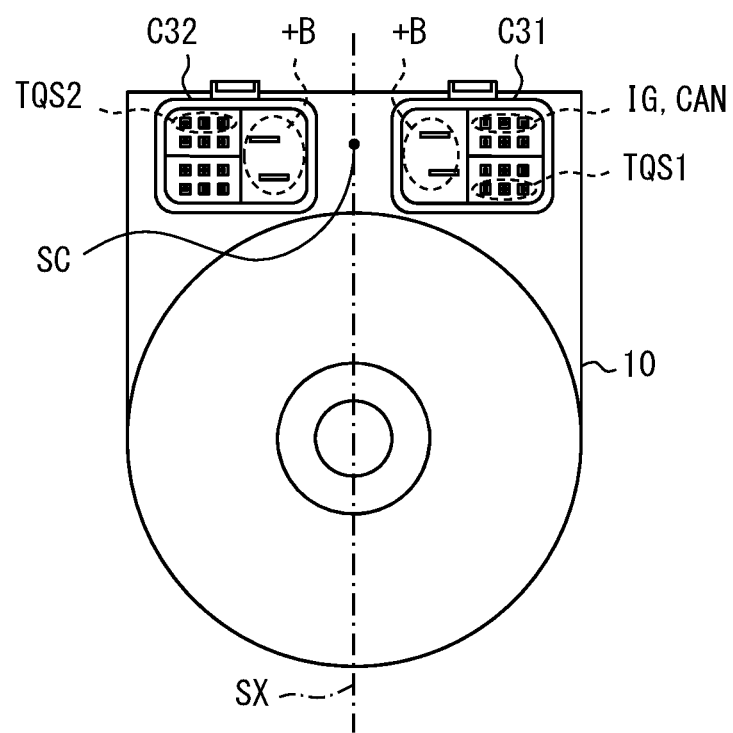
FIG. 25 is a plan view showing a connector of an electric driver device.
Figure 26:
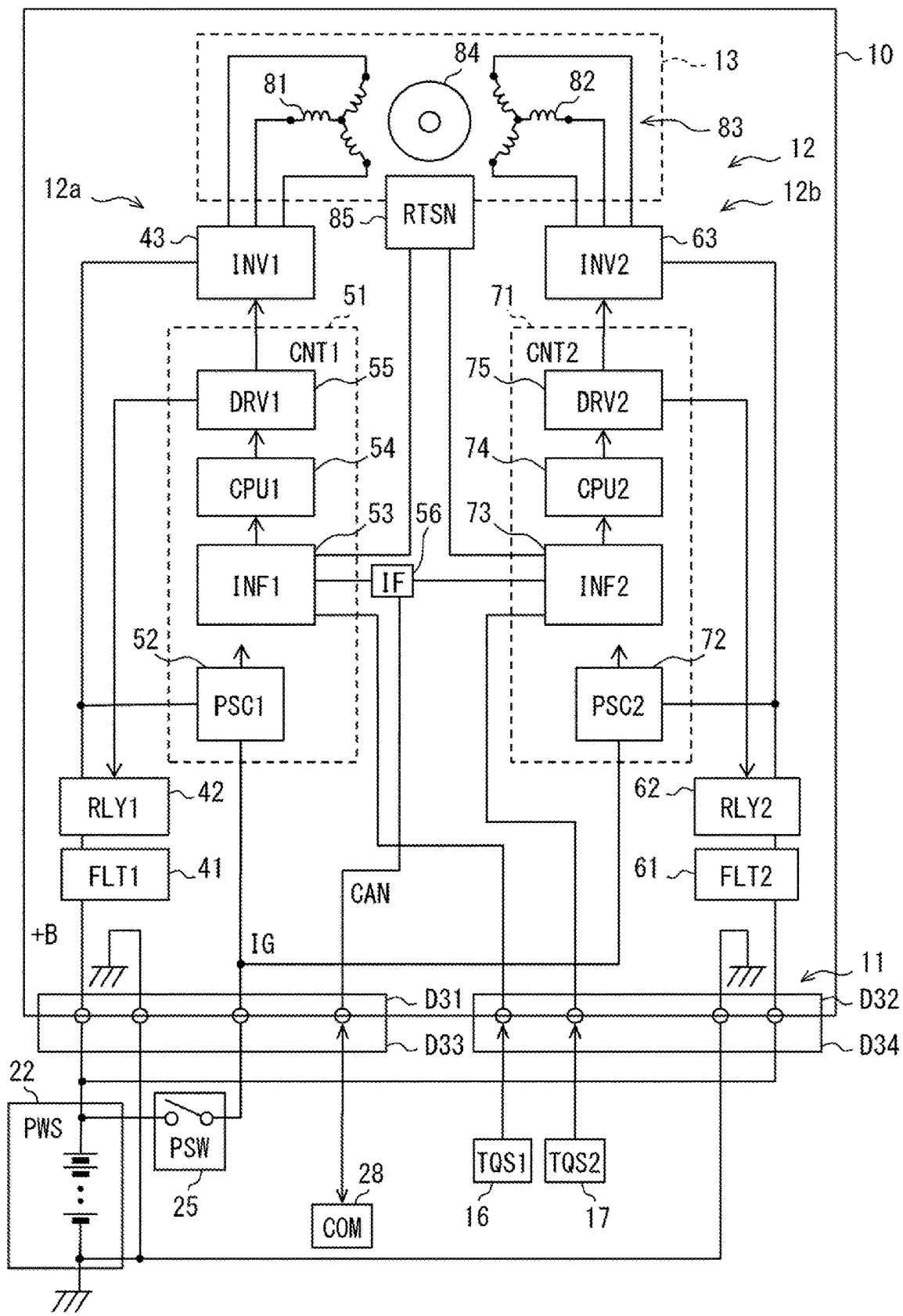
FIG. 26 is a block diagram of an electric driver device according to a thirteenth embodiment.

FIG. 25 illustrates an arrangement of the connectors C31 and C32 in the electric driver device 10. A line symmetry axis SX is virtually illustrated between the connector C31 and the connector C32. The line symmetry axis SX passes between the connectors C31 and C32 and passes through a center of the electric driver device 10. The point symmetry center SC is virtually illustrated between the connector C31 and the connector C32. The point symmetry center SC is also a rotation center of the connector C31 and the connector C32.

The connector C31 and the connector C32 have different shapes with respect to the arrangement of the plurality of electrodes. Therefore, an erroneous connection in which the connector C34 is connected to the connector C31 is mechanically prevented.

Further, the electrodes arranged in the connector C31 and the electrodes arranged in the connector C32 with respect to the function (i.e., signal) are not line-symmetric with respect to the line symmetry axis SX. The electrodes arranged in the connector C31 and the electrodes arranged in the connector C32 with respect to function (i.e., signal) are not point-symmetric with respect to the point symmetry center SC. Therefore, when an erroneous connection occurs, the control devices 51 and 71 in a plurality of circuit systems cannot obtain an expected signal. Therefore, an erroneous connection is easily revealed electrically.

In this embodiment, electrodes for a plurality of redundant circuit systems are intensively arranged in one connector C31. In other words, the plurality of electrodes for input/output signals are arranged in the plurality of connectors C31 and C32 in an intensive manner for each function. From another viewpoint, electrodes for a plurality of circuit systems are mixedly arranged in one connector C31. A signal of the single operation switch device 25 belonging to the operation switch system 24 passes through an electrode arranged only in the connector C31. The signal of the operation switch device 25 is branched into a plurality of circuit systems in the electric driver device 10. The signals on the single communication line 28 belonging to the communication system 27 pass through electrodes arranged only on the connector C31. The signal from the communication line 28 is branched into a plurality of circuit systems in the electric driver device 10. Also in this embodiment, the connectors 11 are not separated and independent from each other for each redundant circuit system. Also in this embodiment, high reliability can be realized in the electric steering device 1 or the electric driver device 10 while providing a high degree of freedom in electrode arrangement in the connector 11.

Thirteenth Embodiment

This embodiment is a modification based on the twelfth embodiment. The asymmetric connector 11 can be realized by various arrangements of a plurality of electrodes. This embodiment provides an example of an asymmetric electrode arrangement on the connector 11.

In FIG. 24, the connector 11 includes device-side connectors C31 and C32 and vehicle-side connectors C33 and C34. The first connectors D31 and D33 connect the signal of the operation switch device 25. The first connectors D31 and D33 connect signals of the communication line 28. The second connectors D32 and D34 connect both signals of the two redundant torque sensors 16 and 17. A plurality of electrodes for the two torque sensor signals TQS1 and TQS2 are intensively arranged in the connector D31. In another aspect, a plurality of electrodes for a plurality of circuit systems are mixedly arranged in one connector D31. From another viewpoint, a plurality of electrodes for input/output signals are arranged in a plurality of connectors D32 in an intensive manner for each function.

Figure 27:
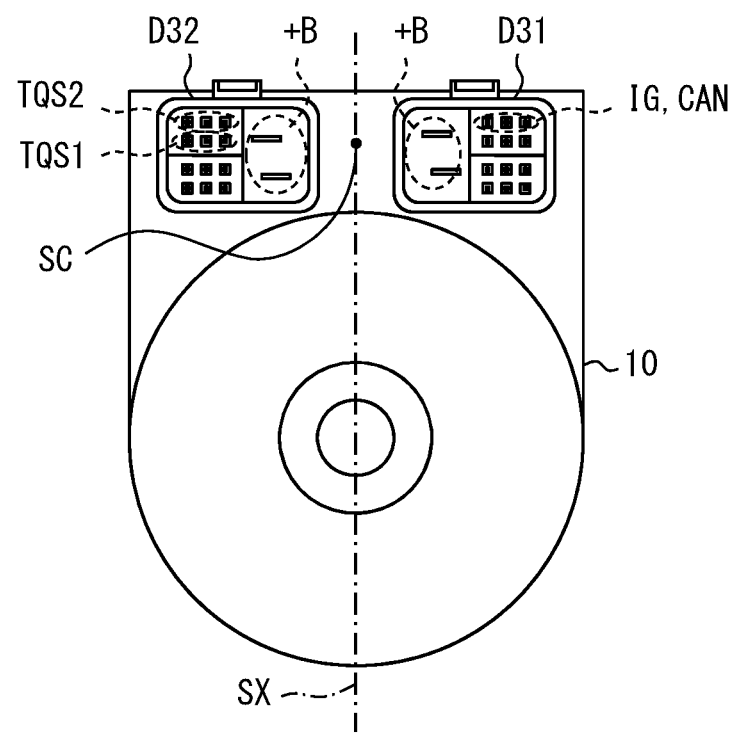
FIG. 27 is a plan view showing a connector of an electric driver device.

FIG. 27 illustrates an arrangement of the connectors D31 and D32 in the electric driver device 10. The connector D31 and the connector D32 have different shapes with respect to the arrangement of the plurality of electrodes. Therefore, an erroneous connection in which the connector C34 is connected to the connector C31 is mechanically prevented.

Further, the electrodes arranged in the connector D31 and the electrodes arranged in the connector D32 with respect to the function (i.e., signal) are not line-symmetric with respect to the line symmetry axis SX. The electrodes arranged in the connector D31 and the electrodes arranged in the connector D32 with respect to function (i.e., signal) are not point-symmetric with respect to the point symmetry center SC. Therefore, when an erroneous connection occurs, the control devices 51 and 71 in a plurality of circuit systems cannot obtain an expected signal. Therefore, an erroneous connection is easily revealed electrically. Also in this embodiment, the same effects as those of the preceding embodiments can be obtained.

Fourteenth Embodiment

This embodiment is a modification based on the twelfth embodiment. This embodiment provides an example of an asymmetric electrode arrangement on the connector 11.

Figure 28:
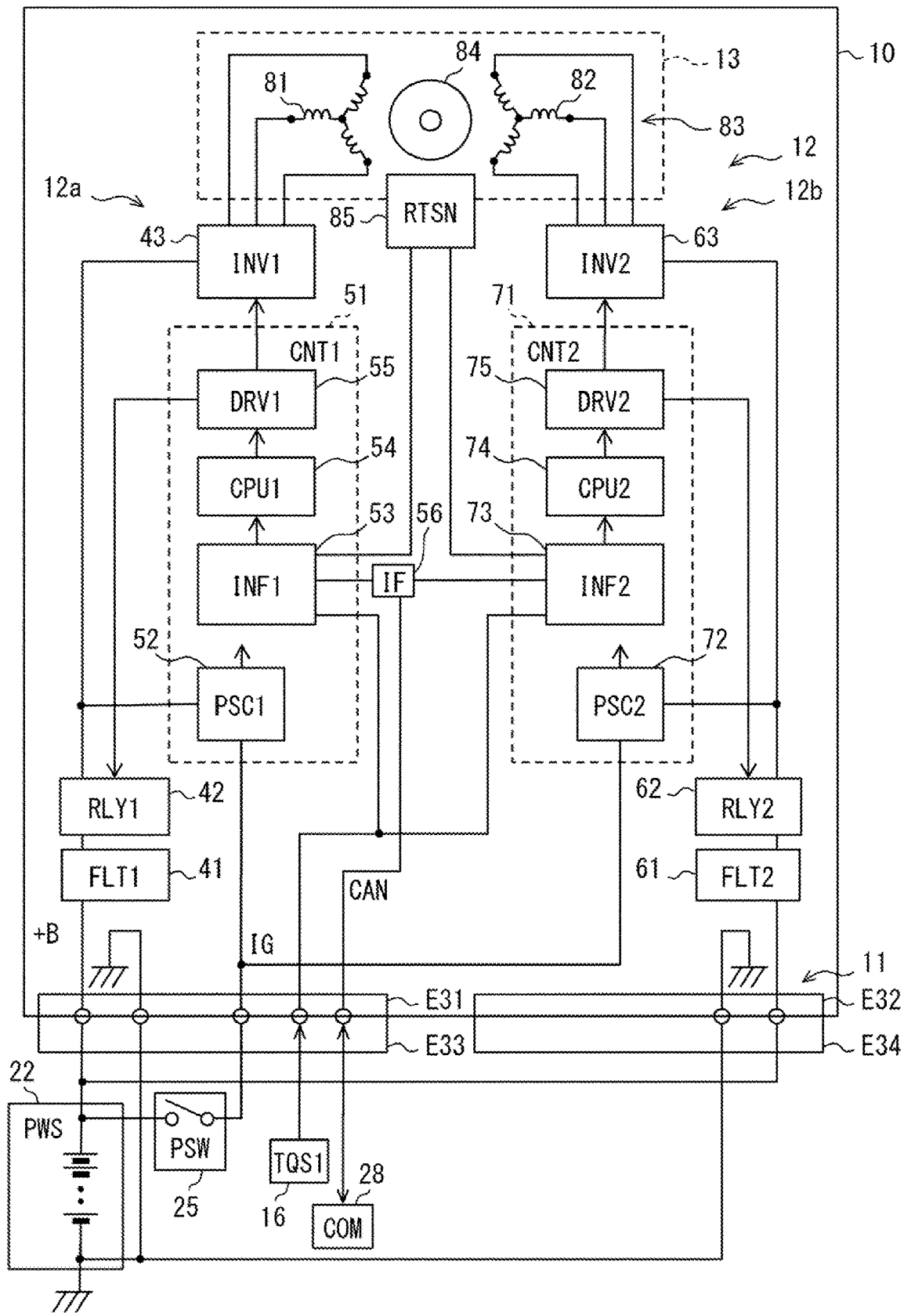
FIG. 28 is a block diagram of an electric driver device according to a fourteenth embodiment.

In FIG. 28, the connector 11 includes device-side connectors E31 and E32 and vehicle-side connectors E33 and E34.

The first connectors E31 and E33 connect the signal of the operation switch device 25. The first connectors E31 and E33 connect signals of the communication line 28. The first connectors E31 and E33 connect signals of a single torque sensor 16 that is not redundant. The signal of the operation switch device 25, the signal of the communication line 28, and the signal of the torque sensor 16 are branched into a plurality of circuit systems inside the electric driver device 10.

Figure 29:
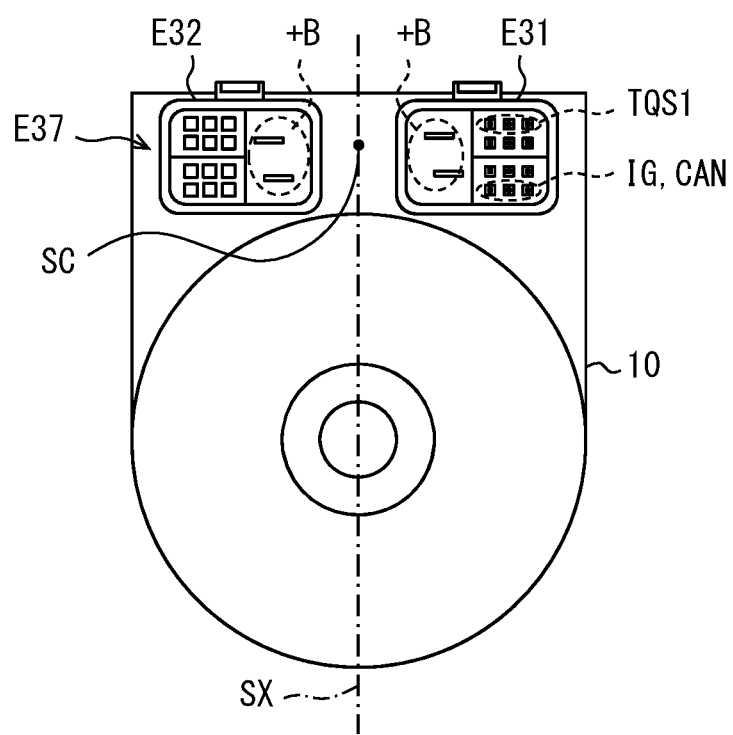
FIG. 29 is a plan view showing a connector of an electric driver device.

FIG. 29 illustrates an arrangement of the connectors E31 and E32 in the electric driver device 10. The connector E32 has a plurality of empty positions E37 for a plurality of electrodes. The connector E31 and the connector E32 have different shapes with respect to the arrangement of the plurality of electrodes. Therefore, an erroneous connection in which the connector E34 is connected to the connector E31 is mechanically prevented.

Further, the electrodes arranged in the connector E31 and the electrodes arranged in the connector E32 with respect to the function (i.e., signal) are not line-symmetric with respect to the line symmetry axis SX. The electrodes arranged in the connector E31 and the electrodes arranged in the connector E32 with respect to function (i.e., signal) are not point-symmetric with respect to the point symmetry center SC. Therefore, when an erroneous connection occurs, the control devices 51 and 71 in a plurality of circuit systems cannot obtain an expected signal. Therefore, an erroneous connection is easily revealed electrically. Also in this embodiment, the same effects as those of the preceding embodiments can be obtained.

Fifteenth Embodiment

This embodiment is a modification based on the twelfth embodiment. This embodiment provides an example of an asymmetric electrode arrangement on the connector 11. Furthermore, this embodiment provides an example applied to a fully redundant system.

Figure 30:
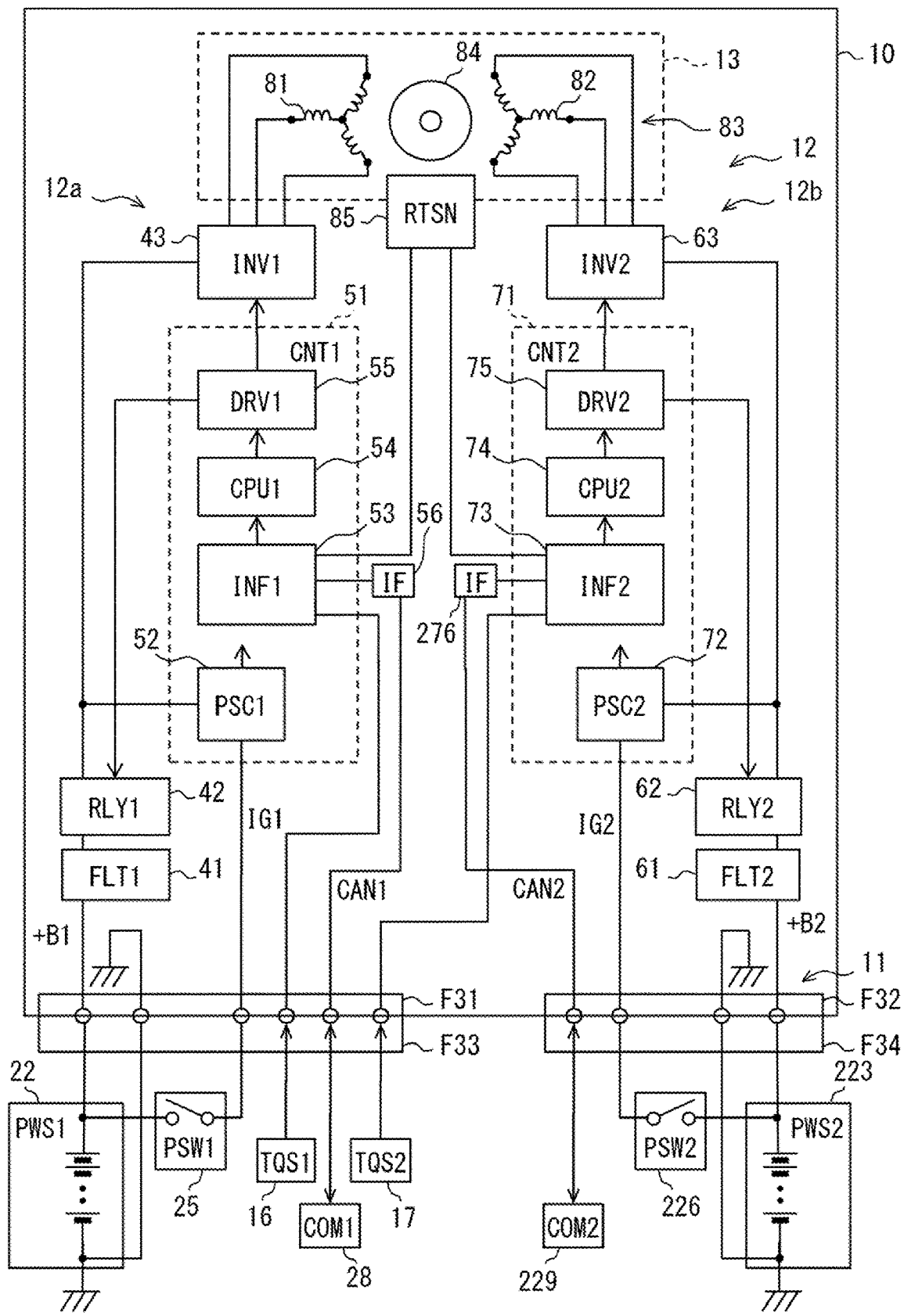
FIG. 30 is a block diagram of an electric driver device according to a fifteenth embodiment.

In FIG. 30, the connector 11 includes device-side connectors F31 and F32 and vehicle-side connectors F33 and F34.

The first connectors F31 and F33 connect the signal of the operation switch device 25. The first connectors F31 and F33 connect signals of the communication line 28. The first connectors F31 and F33 connect both signals of the two redundant torque sensors 16 and 17.

The second connectors F32 and F34 connect the signal of the operation switch device 226. The second connectors F32 and F34 connect signals of the communication line 229.

Therefore, in this embodiment, the electrodes for the signal of the redundant torque sensor system 15 are intensively arranged on the first connectors F31 and F33.

Figure 31:
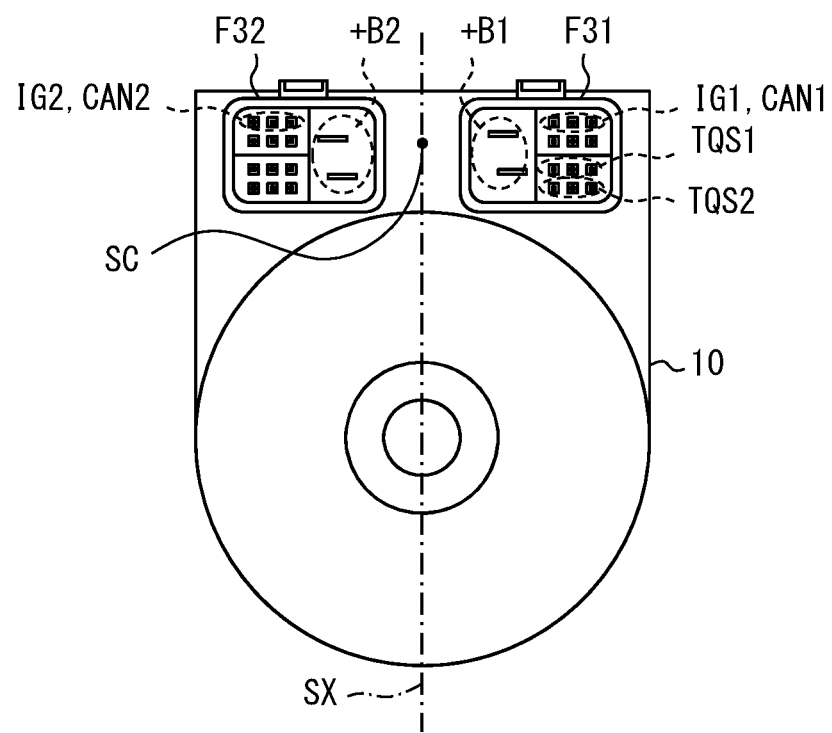
FIG. 31 is a plan view showing a connector of an electric driver device.

FIG. 31 illustrates an arrangement of the connectors F31 and F32 in the electric driver device 10. The connector F31 and the connector F32 have different shapes with respect to the arrangement of the plurality of electrodes. Therefore, an erroneous connection in which the connector F34 is connected to the connector F31 is mechanically prevented.

Further, the electrodes arranged in the connector F31 and the electrodes arranged in the connector F32 with respect to the function (i.e., signal) are not line-symmetric with respect to the line symmetry axis SX. The electrodes arranged in the connector F31 and the electrodes arranged in the connector F32 with respect to function (i.e., signal) are not point-symmetric with respect to the point symmetry center SC. Therefore, when an erroneous connection occurs, the control devices 51 and 71 in a plurality of circuit systems cannot obtain an expected signal. Therefore, an erroneous connection is easily revealed electrically. Also in this embodiment, the same effects as those of the preceding embodiments can be obtained.

Sixteenth Embodiment

This embodiment is a modification based on the twelfth embodiment. This embodiment provides an example of an asymmetric electrode arrangement on the connector 11. Furthermore, this embodiment provides an example applied to a fully redundant system.

Figure 32:
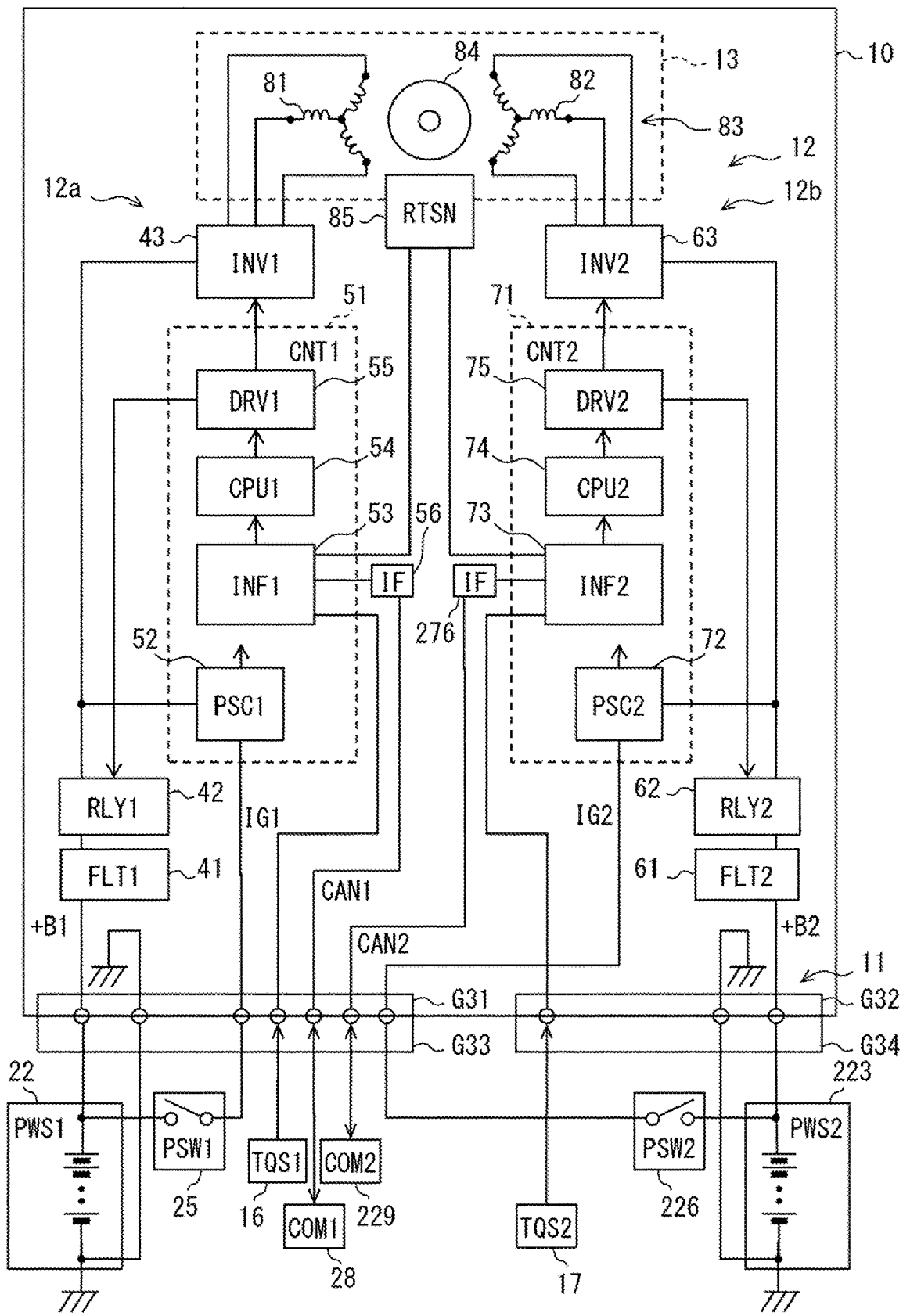
FIG. 32 is a block diagram of an electric driver device according to a sixteenth embodiment.

In FIG. 32, the connector 11 includes device-side connectors G31 and G32 and vehicle-side connectors G33 and G34.

The first connectors G31 and G33 connect both signals of the two redundant operation switch devices 25 and 226. The first connectors G31 and G33 connect signals of the communication line 28. The first connectors G31 and G33 connect signals of the torque sensor 16. The first connectors G31 and G33 connect both signals of the two redundant communication lines 28 and 229.

The second connectors G32 and G34 connect signals of the torque sensor 17.

Therefore, the electrodes for the signals of the redundant operation switch system 24 are intensively arranged in the first connectors G31 and G33. In addition, the electrodes for the signals of the redundant communication system 27 are intensively arranged in the first connectors G31 and G33.

Figure 33:
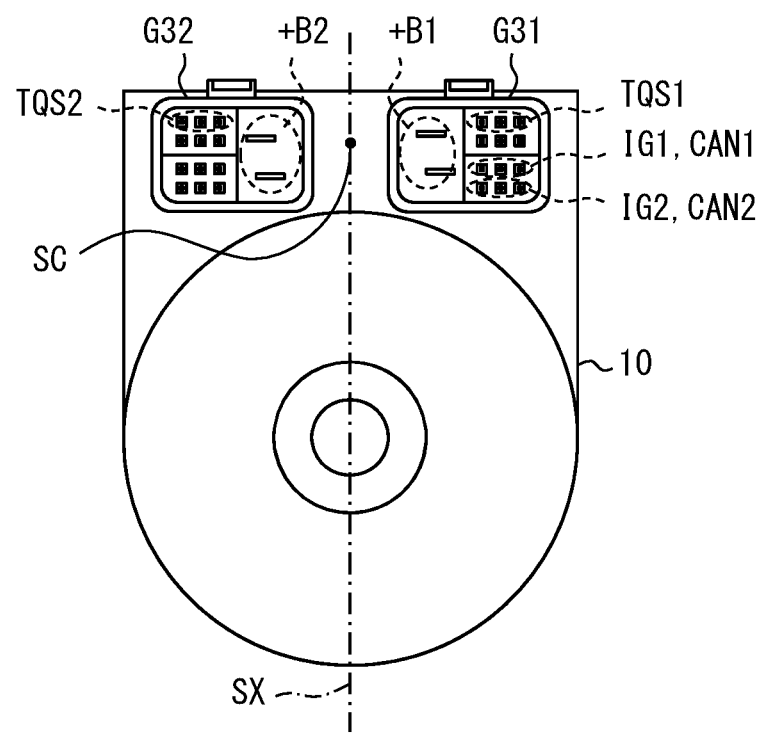
FIG. 33 is a plan view showing a connector of an electric driver device.

FIG. 33 illustrates an arrangement of the connectors G31 and G32 in the electric driver device 10. The connector G31 and the connector G32 have different shapes with respect to the arrangement of the plurality of electrodes. Therefore, an erroneous connection in which the connector G34 is connected to the connector G31 is mechanically prevented.

Further, the electrodes arranged in the connector G31 and the electrodes arranged in the connector G32 with respect to the function (i.e., signal) are not line-symmetric with respect to the line symmetry axis SX. The electrodes arranged in the connector G31 and the electrodes arranged in the connector G32 with respect to function (i.e., signal) are not point-symmetric with respect to the point symmetry center SC. Therefore, when an erroneous connection occurs, the control devices 51 and 71 in a plurality of circuit systems cannot obtain an expected signal. Therefore, an erroneous connection is easily revealed electrically. Also in this embodiment, the same effects as those of the preceding embodiments can be obtained.

Seventeenth Embodiment

This embodiment is a modification based on the twelfth embodiment. This embodiment provides an example of an asymmetric electrode arrangement on the connector 11. Furthermore, this embodiment provides an example applied to a fully redundant system.

Figure 34:
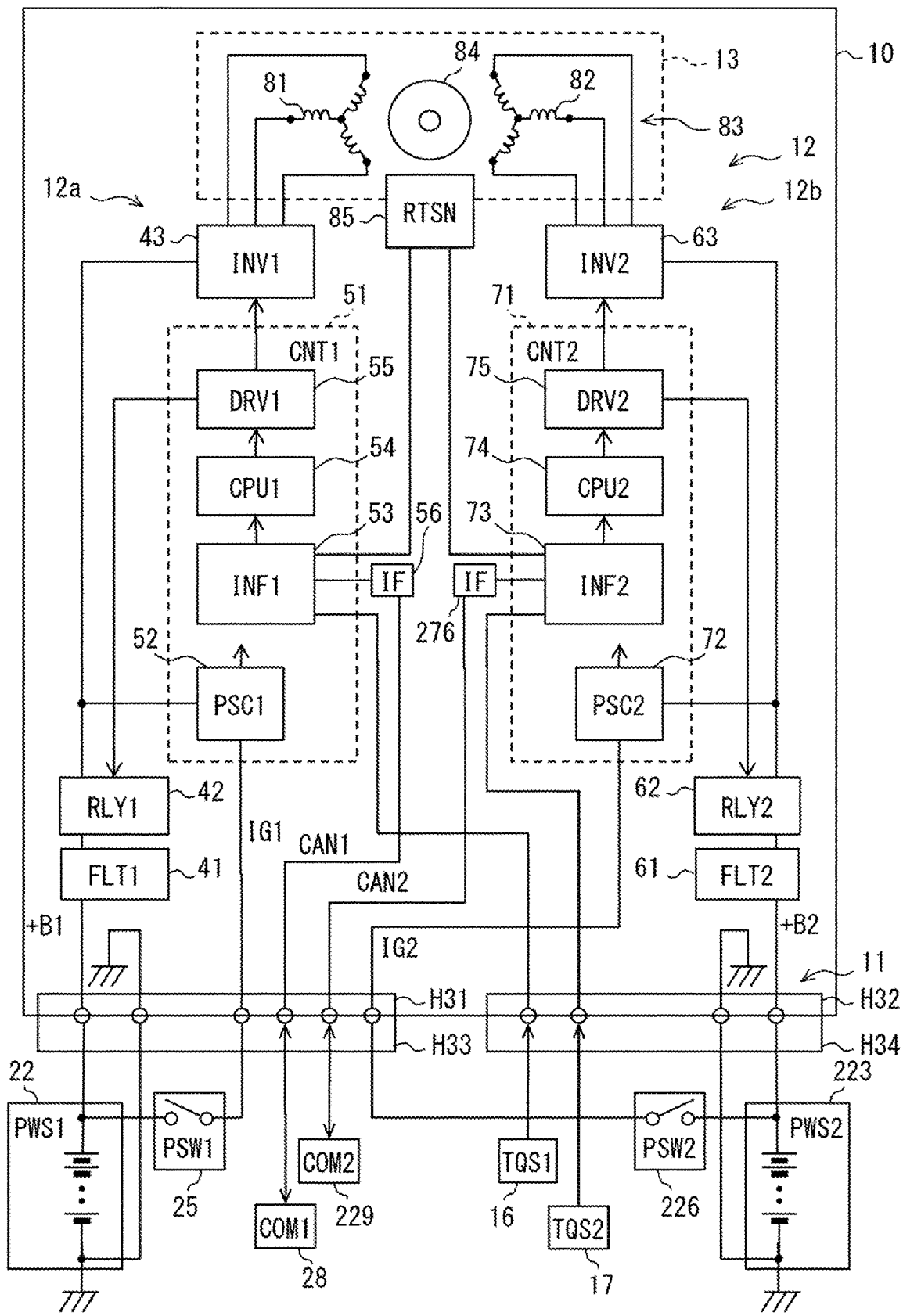
FIG. 34 is a block diagram of an electric driver device according to a seventeenth embodiment.

In FIG. 34, the connector 11 includes device-side connectors H31 and H32 and vehicle-side connectors H33 and H34.

The first connectors H31, H33 connect both signals of the two redundant operation switch devices 25 and 226. The first connectors H31 and H33 connect both signals of the two redundant communication lines 28 and 229.

The second connectors H32 and H34 connect both signals of the two redundant torque sensors 16 and 17.

Therefore, the electrodes for the signals of the redundant operation switch system 24 are intensively arranged in the first connectors H31 and H33. The electrodes for signals of the redundant communication system 27 are intensively arranged in the first connectors H31 and H33. The electrodes for signals of the redundant torque sensor system 15 are intensively arranged in the second connectors H32 and H34.

Figure 35:
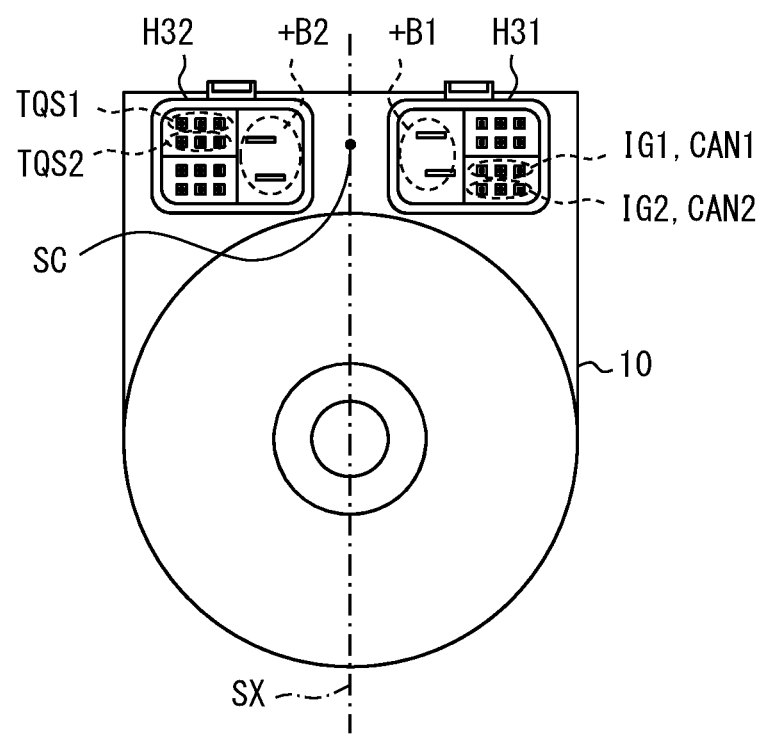
FIG. 35 is a plan view showing a connector of an electric driver device.

FIG. 35 illustrates an arrangement of the connectors H31 and H32 in the electric driver device 10. The connector H31 and the connector H32 have different shapes with respect to the arrangement of the plurality of electrodes. Therefore, an erroneous connection in which the connector H34 is connected to the connector H31 is mechanically prevented.

Further, the electrodes arranged in the connector H31 and the electrodes arranged in the connector H32 with respect to the function (i.e., signal) are not line-symmetric with respect to the line symmetry axis SX. The electrodes arranged in the connector H31 and the electrodes arranged in the connector H32 with respect to function (i.e., signal) are not point-symmetric with respect to the point symmetry center SC. Therefore, when an erroneous connection occurs, the control devices 51 and 71 in a plurality of circuit systems cannot obtain an expected signal. Therefore, an erroneous connection is easily revealed electrically. Also in this embodiment, the same effects as those of the preceding embodiments can be obtained.

Eighteenth Embodiment

This embodiment is a modification based on the twelfth embodiment. This embodiment provides an example of an asymmetric electrode arrangement on the connector 11. Furthermore, this embodiment provides an example applied to a fully redundant system.

Figure 36:
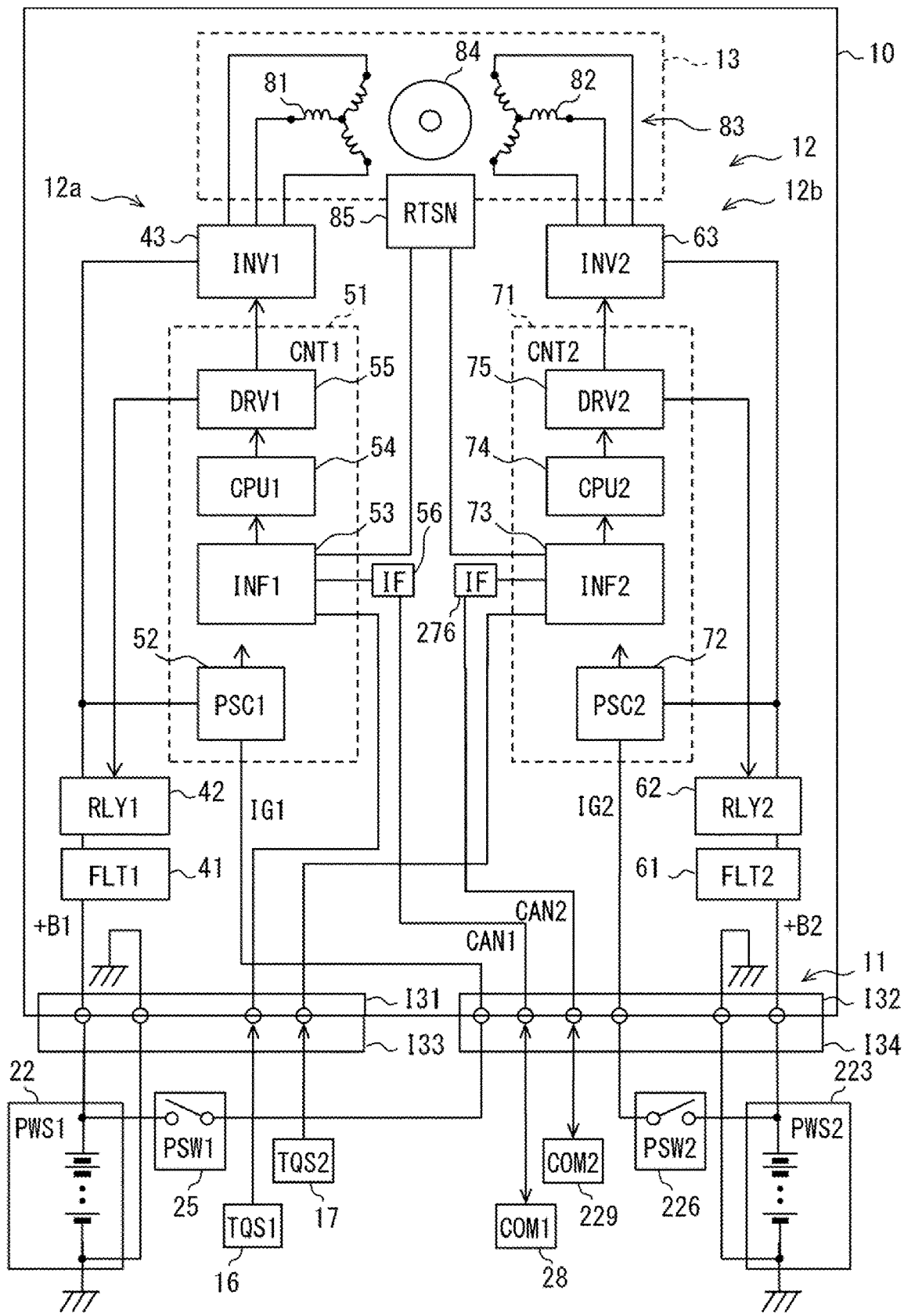
FIG. 36 is a block diagram of an electric driver device according to an eighteenth embodiment.

In FIG. 36, the connector 11 includes device-side connectors I31 and I32 and vehicle-side connectors I33 and I34.

The first connectors I31 and I33 connect the signal of the operation switch device 25. The first connectors I31 and I33 connect both signals of the two redundant torque sensors 16 and 17.

The second connectors I32 and I34 connect the signal of the operation switch device 226. The second connectors I32 and I34 connect both signals of the two redundant communication lines 28 and 229.

Therefore, the electrodes for the signal of the redundant torque sensor system 15 are intensively arranged in the first connectors I31 and I33. The electrodes for signals of the redundant communication system 27 are intensively arranged in the second connectors I32 and I34.

Figure 37:
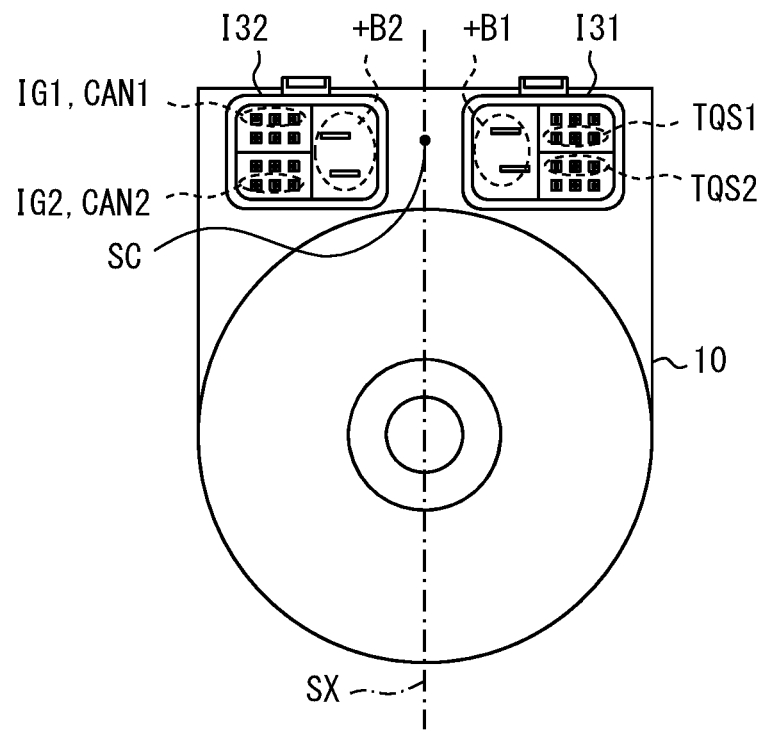
FIG. 37 is a plan view showing a connector of an electric driver device.

FIG. 37 illustrates an arrangement of the connectors I31 and I32 in the electric driver device 10. The connector I31 and the connector I32 have different shapes with respect to the arrangement of the plurality of electrodes. Therefore, an erroneous connection in which the connector I34 is connected to the connector I31 is mechanically prevented.

Further, the electrodes arranged in the connector I31 and the electrodes arranged in the connector I32 with respect to the function (i.e., signal) are not line-symmetric with respect to the line symmetry axis SX. The electrodes arranged in the connector I31 and the electrodes arranged in the connector I32 with respect to function (i.e., signal) are not point-symmetric with respect to the point symmetry center SC. Therefore, when an erroneous connection occurs, the control devices 51 and 71 in a plurality of circuit systems cannot obtain an expected signal. Therefore, an erroneous connection is easily revealed electrically. Also in this embodiment, the same effects as those of the preceding embodiments can be obtained.

OTHER EMBODIMENTS

The disclosure in this specification, the drawings, and the like is not limited to the illustrated embodiments. The disclosure encompasses the illustrated embodiments and variations thereof by those skilled in the art. For example, the present disclosure is not limited to the combinations of components and/or elements shown in the embodiments. The present disclosure may be implemented in various combinations. The present disclosure may have additional portions which may be added to the embodiments. The present disclosure encompasses omission of the components and/or elements of the embodiments. The present disclosure encompasses the replacement or combination of components and/or elements between one embodiment and another. The disclosed technical scope is not limited to the description of the embodiment. Several technical scopes disclosed are indicated by descriptions in the claims and should be understood to include all modifications within the meaning and scope equivalent to the descriptions in the claims.

The disclosure in the specification, drawings and the like is not limited by the description of the claims. The disclosures in the specification, the drawings, and the like encompass the technical ideas described in the claims, and further extend to a wider variety of technical ideas than those in the claims. Therefore, various technical ideas can be extracted from the disclosure of the specification, the drawings and the like without being limited to the description of the claims.

In the above embodiment, the electric driver device 10 is used as a power source for providing the electric steering device 1. Alternatively, the electric driver device 10 can be used for various applications. The electric driver device 10 can be used for, for example, a motor device for generating propulsion power, a brake device, a wiper device, and the like.

In the above embodiment, redundancy is realized by providing two circuit systems. Alternatively, redundancy may be realized by providing a plurality of circuit systems such as three, four, and the like. Further, the redundancy by two circuit systems and the redundancy by three circuit systems may be used together. For example, the arithmetic processing unit circuit alone may be triple-redundant by three circuit systems.

In the above embodiment, the plurality of diode elements 52*c*, 72*c*, 92*a*, and 92*b* are used to provide the OR circuit 92. Alternatively, a transistor element or the like may be used instead of the diode element.

In the plurality of embodiments described above, at least one of the power cutoff circuits 42 and 62, the interface circuits 53 and 73, and the power supply circuits 52 and 72 is provided by a common circuit 90 common to at least two of the plurality of circuit systems 12*a* and 12*b*. When the electric driver device 10 has three or more circuit systems, the common circuit 90 may be common across three or more circuit systems. Further, the electric circuit 12 may include a plurality of common circuits 90 that provide any two or more of the power cutoff circuits 42 and 62, the interface circuits 53 and 73, and the power supply circuits 52 and 72. Further, the electric circuit 12 may include three common circuits 90 that provide all of the power cutoff circuits 42 and 62, the interface circuits 53 and 73, and the power supply circuits 52 and 72.

In the above embodiments, various embodiments of the common circuit 90 have been described. Alternatively, the common circuits 90 in the plurality of the above embodiments may be used together in a single embodiment. For example, the common power supply circuit 91 in the first embodiment and the common interface circuit 391 in the third embodiment may be adopted in a single embodiment. For example, the common power supply circuit 291 in the second embodiment and the common interface circuit 491 in the fourth embodiment may be adopted in a single embodiment. In addition, the structure of the connector 11 described in the above embodiments may be used together with the common circuit 90.

What is claimed is:
1. An electric driver device, comprising:
a motor for driving an object to be driven; and
an electric circuit including a plurality of circuit systems for controlling the motor, wherein
each of the plurality of circuit systems includes:
a power conversion circuit for controlling power supplied to the motor;
an arithmetic processing unit circuit for calculating a control amount of the power conversion circuit according to a plurality of input/output signals; and a drive circuit for driving the power conversion circuit in response to a command from the arithmetic processing unit circuit, wherein at least one circuit is provided by a common circuit which is common over at least two of the plurality of circuit systems, and wherein the at least one circuit includes a power cutoff circuit which cuts off a power supply to the motor, an interface circuit which processes the plurality of input/output signals, and a power supply circuit which supplies power to the arithmetic processing unit circuit and the interface circuit, and wherein the common circuit includes at least one connection line that connects the power supply and/or the plurality of input/output signals in a complemental manner with each other, and the at least one connection line is connected so as to complement the power supply.

2. The electric driver device claimed in claim 1, wherein the at least one connection line provides an OR circuit.

3. The electric driver device claimed in claim 1, wherein the at least one connection line is connected to complement the plurality of input/output signals.

4. An electric driver device, comprising:

a motor for driving an object to be driven; and an electric circuit including a plurality of circuit systems for controlling the motor, wherein each of the plurality of circuit systems includes:

a power conversion circuit for controlling power supplied to the motor;

an arithmetic processing unit circuit for calculating a control amount of the power conversion circuit according to a plurality of input/output signals; and a drive circuit for driving the power conversion circuit in response to a command from the arithmetic processing unit circuit, wherein at least one circuit is provided by a common circuit which is common over at least two of the plurality of circuit systems, and wherein the at least one circuit includes a power cutoff circuit which cuts off power supply to the motor, an interface circuit which processes the plurality of input/output signals, and a power supply circuit which supplies power to the arithmetic processing unit circuit and the interface circuit, and wherein the common circuit includes a connection line that connects the power supply and/or the plurality of input/output signals in a complemental manner with each other, and wherein the connection line is connected to complement the plurality of input/output signals, and wherein the plurality of input/output signals includes a first input signal belonging to one of the at least two of the plurality of circuit systems and a second input signal belonging to an other of the at least two of the plurality of circuit systems, and wherein the common circuit includes:

a first pre-stage interface circuit which processes and outputs the first input signal;

a first post-stage interface circuit which further processes an output of the first pre-stage interface circuit and outputs to the arithmetic processing unit circuit belonging to the one of the at least two of the plurality of circuit systems;

a second pre-stage interface circuit which processes and outputs the second input signal;

a second post-stage interface circuit which further processes an output of the first pre-stage interface circuit and outputs to the arithmetic processing unit circuit belonging to the other of the at least two of the plurality of circuit systems;

a third post-stage interface circuit which further processes an output of the second pre-stage interface circuit and outputs to the arithmetic processing unit circuit belonging to the one of the at least two of the plurality of circuit systems; and a fourth post-stage interface circuit which further processes an output of the first pre-stage interface circuit and outputs to the arithmetic processing unit circuit belonging to the other of the at least two of the plurality of circuit systems.

* * * * *